US012626047B2

(12) United States Patent
Oriordan et al.

(10) Patent No.: US 12,626,047 B2
(45) Date of Patent: May 12, 2026

(54) COMPUTING AND DISPLAYING A PREDICTED OVERLAP SHAPE IN AN IC DESIGN BASED ON PREDICTED MISALIGNMENT OF METAL LAYERS

(71) Applicant: D2S, Inc., San Jose, CA (US)

(72) Inventors: Donald Oriordan, Sunnyvale, CA (US); Akira Fujimura, Saratoga, CA (US); George Janac, Saratoga, CA (US)

(73) Assignee: D2S, INC., San Jose, CA (US)

( * ) Notice: Subject to any disclaimer, the term of this patent is extended or adjusted under 35 U.S.C. 154(b) by 625 days.

(21) Appl. No.: 17/992,899

(22) Filed: Nov. 22, 2022

(65) Prior Publication Data

US 2023/0205972 A1      Jun. 29, 2023

Related U.S. Application Data

(63) Continuation-in-part of application No. 16/949,270, filed on Oct. 22, 2020, now Pat. No. 12,372,864.
(Continued)

(51) Int. Cl.
*G06F 30/30* (2020.01)
*G06F 30/31* (2020.01)
(Continued)

(52) U.S. Cl.
CPC ............ *G06F 30/398* (2020.01); *G06F 30/31* (2020.01); *G06F 30/392* (2020.01)

(58) Field of Classification Search
CPC ...... G06F 30/398; G06F 30/31; G06F 30/392; G06F 30/27; G03F 7/70633; G03F 7/706841; G06N 3/045; G06N 3/08
See application file for complete search history.

(56) References Cited

U.S. PATENT DOCUMENTS

| | | | |
|---|---|---|---|
| 6,510,730 B1 | 1/2003 | Phan et al. | |
| 6,892,365 B2 | 5/2005 | Culp et al. | |

(Continued)

FOREIGN PATENT DOCUMENTS

| | | |
|---|---|---|
| CN | 107438842 A | 12/2017 |
| CN | 111758072 A | 10/2020 |

(Continued)

OTHER PUBLICATIONS

Ajayi, Tutu, et al., "OpenROAD: Toward a Self-Driving, Open-Source Digital Layout Implementation Tool Chain," Proceedings of Government Microcircuit Applications and Critical Technology Conference, Jan. 1, 2019, 6 pages, National Science Foundation, retrieved from https://vlsicad.ucsd.edu/Publications/Conferences/370/c370.pdf.

(Continued)

*Primary Examiner* — Jack Chiang
*Assistant Examiner* — Brandon Bowers
(74) *Attorney, Agent, or Firm* — ADELI LLP

(57) ABSTRACT

Some embodiments provide a method for computing and displaying of minimum overlap for semiconductor layer interfaces, such as metal-via and metal-contact. The method leverages a machine-trained network (e.g., a trained neural network) to quickly, but accurately, infer the contours for the manufactured shapes across a range of process variations. The method also models the semiconductor process manufacturing layer-to-layer misalignment. The combined set of information (from the machine-trained network and from the modeling) is used by the method to compute the minimum overlap shapes at multiple layer interfaces. The method in some embodiments then uses the minimum overlap shapes to obtain an accurate calculation of the via or contact resistance.

18 Claims, 32 Drawing Sheets

Related U.S. Application Data

(60) Provisional application No. 63/300,675, filed on Jan. 19, 2022.

(51) Int. Cl.
    *G06F 30/392*     (2020.01)
    *G06F 30/398*     (2020.01)

(56) References Cited

U.S. PATENT DOCUMENTS

| | | |
|---|---|---|
| 7,269,817 B2 | 9/2007 | Heng et al. |
| 7,526,748 B2 | 4/2009 | Kotani et al. |
| 7,754,401 B2 | 7/2010 | Fujimura et al. |
| 8,381,155 B1 | 2/2013 | Fick et al. |
| 8,450,804 B2 | 5/2013 | Sekar et al. |
| 8,473,875 B2 | 6/2013 | Fujimura et al. |
| 8,818,072 B2 | 8/2014 | Ong et al. |
| 10,012,900 B2 | 7/2018 | Kim et al. |
| 10,346,740 B2 | 7/2019 | Zhang et al. |
| 10,444,629 B2 | 10/2019 | Zable |
| 10,520,830 B2 | 12/2019 | Kicken et al. |
| 10,651,054 B2 | 5/2020 | Or-Bach et al. |
| 10,670,973 B2 | 6/2020 | Zou et al. |
| 10,678,142 B2 | 6/2020 | Jheng et al. |
| 10,923,318 B2 | 2/2021 | Gledhill et al. |
| 10,949,595 B2 | 3/2021 | Tsutsui et al. |
| 11,043,359 B2 | 6/2021 | Nakamura et al. |
| 2004/0210863 A1 | 10/2004 | Culp et al. |
| 2005/0132306 A1 | 6/2005 | Smith et al. |
| 2005/0251771 A1 | 11/2005 | Robles |
| 2006/0190911 A1 | 8/2006 | Stivers |
| 2008/0109766 A1 | 5/2008 | Song et al. |
| 2008/0134131 A1 | 6/2008 | Asano et al. |
| 2009/0193369 A1 | 7/2009 | Chan et al. |
| 2010/0205575 A1 | 8/2010 | Arora et al. |
| 2011/0049635 A1 | 3/2011 | Carlson |
| 2011/0089345 A1 | 4/2011 | Komagata et al. |
| 2012/0094219 A1 | 4/2012 | Fujimura et al. |
| 2012/0151422 A1 | 6/2012 | White et al. |
| 2013/0022929 A1 | 1/2013 | Komagata et al. |
| 2013/0159943 A1 | 6/2013 | Agarwal et al. |
| 2013/0283216 A1 | 10/2013 | Pearman et al. |
| 2013/0283218 A1 | 10/2013 | Fujimura et al. |
| 2015/0302134 A1 | 10/2015 | Berkens |
| 2016/0042111 A1 | 2/2016 | Chang |
| 2016/0125120 A1 | 5/2016 | Yu et al. |
| 2016/0162621 A1 | 6/2016 | Hamouda |
| 2016/0239601 A1 | 8/2016 | Morisaki et al. |
| 2016/0253450 A1 | 9/2016 | Kandel et al. |
| 2016/0283631 A1 | 9/2016 | Lin et al. |
| 2017/0061044 A1 | 3/2017 | Ning et al. |
| 2017/0194126 A1 | 7/2017 | Bhaskar et al. |
| 2017/0357911 A1 | 12/2017 | Liu et al. |
| 2018/0067900 A1 | 3/2018 | Mos et al. |
| 2018/0315723 A1 | 11/2018 | Singh et al. |
| 2019/0072846 A1 | 3/2019 | Lin et al. |
| 2019/0086200 A1* | 3/2019 | Amit ............... G01B 11/272 |
| 2019/0146355 A1 | 5/2019 | Jheng et al. |
| 2019/0188356 A1 | 6/2019 | Zhang et al. |
| 2019/0197213 A1 | 6/2019 | Ungar |
| 2019/0206041 A1 | 7/2019 | Fang et al. |
| 2019/0354006 A1 | 11/2019 | Hu et al. |
| 2019/0377849 A1 | 12/2019 | Sha et al. |
| 2019/0385300 A1 | 12/2019 | Baidya et al. |
| 2019/0392106 A1 | 12/2019 | Northrop et al. |
| 2020/0051781 A1 | 2/2020 | Fujimura et al. |
| 2020/0065453 A1 | 2/2020 | Kim et al. |
| 2020/0134131 A1 | 4/2020 | Tien et al. |
| 2020/0184137 A1 | 6/2020 | Tsutsui et al. |
| 2020/0364394 A1 | 11/2020 | Yu et al. |
| 2020/0380089 A1 | 12/2020 | Gheith et al. |
| 2020/0380362 A1 | 12/2020 | Cao et al. |
| 2020/0387660 A1 | 12/2020 | Cecil |
| 2021/0048741 A1 | 2/2021 | Lugg et al. |
| 2021/0072635 A1 | 3/2021 | Ma et al. |
| 2021/0173996 A1 | 6/2021 | Hanchinal et al. |
| 2021/0181620 A1 | 6/2021 | Poonawala et al. |
| 2021/0216697 A1 | 7/2021 | Brink et al. |
| 2021/0279878 A1 | 9/2021 | Adler et al. |
| 2021/0397172 A1 | 12/2021 | Slachter et al. |
| 2022/0035237 A1 | 2/2022 | Lee et al. |
| 2022/0050381 A1 | 2/2022 | Biswas et al. |
| 2022/0128899 A1 | 4/2022 | Fujimura et al. |
| 2022/0187713 A1 | 6/2022 | Middlebrooks et al. |
| 2022/0299881 A1 | 9/2022 | Zheng et al. |
| 2023/0024684 A1 | 1/2023 | Fujimura et al. |
| 2023/0027655 A1 | 1/2023 | Fujimura et al. |
| 2023/0032510 A1 | 2/2023 | Fujimura et al. |
| 2023/0092665 A1 | 3/2023 | Fujimura et al. |
| 2023/0107556 A1 | 4/2023 | Tao et al. |
| 2023/0168590 A1 | 6/2023 | Sin et al. |
| 2023/0168660 A1 | 6/2023 | Oriordan et al. |
| 2023/0169245 A1 | 6/2023 | Oriordan et al. |
| 2023/0169246 A1 | 6/2023 | Oriordan et al. |
| 2023/0169247 A1 | 6/2023 | Oriordan et al. |
| 2023/0186009 A1 | 6/2023 | Fujimura et al. |
| 2023/0229836 A1 | 7/2023 | Oriordan et al. |
| 2023/0229840 A1 | 7/2023 | Oriordan et al. |
| 2023/0229844 A1 | 7/2023 | Oriordan et al. |
| 2023/0267265 A1 | 8/2023 | Oriordan |
| 2023/0274065 A1 | 8/2023 | Fujimura |
| 2023/0274066 A1 | 8/2023 | Fujimura |
| 2023/0274067 A1 | 8/2023 | Fujimura |
| 2023/0274068 A1 | 8/2023 | Fujimura |
| 2023/0274069 A1 | 8/2023 | Fujimura |
| 2023/0274070 A1 | 8/2023 | Fujimura |
| 2023/0274071 A1 | 8/2023 | Fujimura |
| 2023/0280659 A1 | 9/2023 | Fu |
| 2023/0281374 A1 | 9/2023 | Fujimura |
| 2023/0282635 A1 | 9/2023 | Fujimura |
| 2023/0306177 A1 | 9/2023 | Fujimura |
| 2023/0351087 A1 | 11/2023 | Oriordan et al. |
| 2023/0351088 A1 | 11/2023 | Oriordan et al. |
| 2023/0351089 A1 | 11/2023 | Oriordan et al. |
| 2023/0359804 A1 | 11/2023 | Oriordan |
| 2024/0220702 A1 | 7/2024 | Thulasi et al. |
| 2024/0288764 A1 | 8/2024 | Hamouda |
| 2024/0334611 A1 | 10/2024 | Thulasi et al. |

FOREIGN PATENT DOCUMENTS

| | | |
|---|---|---|
| CN | 113168085 A | 7/2021 |
| CN | 113168115 A | 7/2021 |
| EP | 3951496 A1 | 2/2022 |
| JP | 2004320004 A | 11/2004 |
| JP | 2007536581 A | 12/2007 |
| JP | 2008122929 A | 5/2008 |
| JP | 2012181298 A | 9/2012 |
| JP | 2019114295 A | 7/2019 |
| JP | 2021509208 A | 3/2021 |
| KR | 102170578 B1 | 10/2020 |
| KR | 20210010897 A | 1/2021 |
| KR | 102377411 B1 | 3/2022 |
| TW | I710763 B | 11/2020 |
| TW | 202113501 A | 4/2021 |
| TW | 202121050 A | 6/2021 |
| WO | 2018125220 A1 | 7/2018 |
| WO | 2020193095 A1 | 10/2020 |
| WO | 2021041963 A1 | 3/2021 |
| WO | 2021043936 A1 | 3/2021 |
| WO | 2022086825 A1 | 4/2022 |
| WO | 2023141045 A2 | 7/2023 |

OTHER PUBLICATIONS

Author Unknown, "Boolean operations on polygons," Wikipedia, Oct. 12, 2019, 3 pages, Wikipedia.com.

Author Unknown, "Cadence Virtuoso Layout Suite for Electrically Aware Design," Cadence, Jun. 2013, 2 pages, Cadence Design Systems, Inc.

Author Unknown, "Custom Compiler: Best-in-Class Technology for Advanced-node Custom Design," Synopsys Datasheet, Oct. 18, 2018, 5 pages, Synopsys, Inc.

(56) References Cited

OTHER PUBLICATIONS

Author Unknown, "D2S Enables "Stitchless" Full-Chip Inverse Lithography Technology in a Single Day for the Multi-Beam Era," Press Release, Sep. 16, 2019, 3 pages, D2S, Inc., San Jose, California, USA.

Author Unknown, "D2S Unveils Industry's First Mask-Wafer Double Simulation Platform," Press Release, Sep. 20, 2011, 3 pages, D2S, Inc., San Jose, California, USA.

Author Unknown, "Deep reinforcement learning," Wikipedia, Sep. 21, 2020, 2 pages, Wikipedia.com.

Author Unknown, "Design rule checking," Wikipedia, May 27, 2020, 4 pages, Wikipedia.com.

Author Unknown, "Greiner-Hormann clipping algorithm," Wikipedia, Dec. 5, 2019, 3 pages, Wikipedia.com.

Author Unknown, "Marching squares," Wikipedia, Dec. 30, 2019, 9 pages, Wikipedia.com.

Author Unknown, "Multiple patterning," Wikipedia, Oct. 10, 2020, 22 pages, Wikipedia.com.

Author Unknown, "Optical proximity correction," Wikipedia, Apr. 28, 2019, 5 pages, Wikipedia.com.

Author Unknown, "Rasterisation," Wikipedia, Aug. 21, 2020, 4 pages, Wikipedia.com.

Author Unknown, "Sutherland-Hodgman algorithm," Wikipedia, Feb. 20, 2020, 4 pages, Wikipedia.com.

Author Unknown, "TrueMask® DS," Exact Date Unknown but Before May 2020, 3 pages, D2S, Inc., retrieved from https://design2silicon.com/products/truemask-ds/.

Author Unknown, "TrueMask® ILT Backgrounder Stitchless Full-Chip ILT in a Day," Backgrounder, Sep. 2019, 6 pages, D2S, Inc., San Jose, California, USA.

Author Unknown, "TrueMask® ILT," Exact Date Unknown but Before May 2020, 7 pages, D2S, Inc., retrieved from https://design2silicon.com/products/truemask-ilt/.

Cecil, Thomas, et al., "Establishing Fast, Practical, Full-Chip ILT Flows Using Machine Learning," SPIE Proceedings 11327, Optical Microlithography XXXIII, Mar. 23, 2020, 19 pages, vol. 1132706, SPIE, San Jose, California, USA.

Chen, Kun-Yuan, et al., "Full-Chip Application of Machine Learning SRAFs on DRAM Case Using Auto Pattern Selection," SPIE Proceedings 10961, Optical Microlithography XXXII, Oct. 10, 2019, 13 pages, vol. 1096108, SPIE, San Jose, California, USA.

Chen, Tai-Chen, "Multilevel Full-Chip Gridless Routing With Applications to Optical-Proximity Correction," Jun. 2007, 13 pages, IEEE, retrieved from http://cc.ee.ntu.edu.tw/~ywchang/Papers/tcad07-mgr.pdf.

Ibtehaz, Nabil, et al., "MultiResUNet: Rethinking the U-Net Architecture for Multimodal Biomedical Image Segmentation," Feb. 11, 2019, 25 pages, retrieved from https://arxiv.org/pdf/1902.04049.pdf.

Jia, Ningning, et al., "Machine Learning for Inverse Lithography: using stochastic gradient descent for robust photomask synthesis," Journal of Optics, Apr. 1, 2010, 9 pages, vol. 12, IOP Publishing, retrieved from https://www.eee.hku.hk/optima/pub/journal/1004_JO.pdf.

Kwan, Joe, et al., "Applying Machine Learning Techniques to Accelerate Advanced Process Yield Ramp," Jan. 5, 2021, 29 pages, Siemens Digital Industries Software, Munich, Germany.

Lin, Yibo, et al., "Machine Learning for Yield Learning and Optimization," 2018 IEEE International Test Conference (ITC), Oct. 29-Nov. 1, 2018, 10 pages, IEEE, Phoenix, AZ, USA.

Liu, Peng, "Mask Synthesis Using Machine Learning Software and Hardware Platforms," SPIE Proceedings 11327, Optical Microlithography XXXIII, Mar. 23, 2020, 17 pages, vol. 1132707, SPIE, San Jose, California, USA.

Naik, Mehul, "Challenges to Interconnect Scaling at 3nm and Beyond," Applied Materials, Jun. 14, 2021, 9 pages, Applied Materials, Inc., retrieved from https://www.appliedmaterials.com/us/en/blog/blog-posts/challenges-to-interconnect-scaling-at-3nm-and-beyond.html.

Pang, Linyong (Leo), et al., "Study of Mask and Wafer Co-design That Utilizes a New Extreme SIMD Approach to Computing in Memory Manufacturing: Full-Chip Curvilinear ILT in a Day," SPIE Proceedings 11148, Photomask Technology 2019, Oct. 3, 2019, 16 pages, vol. 111480U, SPIE, retrieved from https://design2silicon.com/wp-content/uploads/2019/11/2019-BACUS-Full-Chip-Curvilinear-ILT-091219s-003.pdf.

Pang, Linyong, "Inverse Lithography Technology: 30 years from concept to practical, full-chip reality," Journal of Micro/Nanopatterning, Materials, and Metrology, Aug. 31, 2021, 49 pages, vol. 20(3), SPIE, retrieved from https://www.spiedigitallibrary.org/journals/journal-of-micro-nanopatterning-materials-and-metrology/volume20/issue-03/030901/Inverse-lithography-technology--30-years-from-concept-to-practical/10.1117/1.JMM.20.3.030901.full.

Pang, Linyong, et al., "How GPU-Accelerated Simulation Enables Applied Deep Learning for Masks and Wafers," Photomask Japan 2019: XXVI Symposium on Photomask and Next-Generation Lithography Mask Technology, Apr. 16-18, 2019, 10 pages, SPIE, Yokohama, Japan.

Pang, Linyong, et al., "Making Digital Twins using the Deep Learning Kit (DLK)," Photomask Technology 2019, Sep. 15-19, 2019, 13 pages, SPIE, Monterey, California, USA.

PCT International Search Report and Written Opinion of Commonly Owned International Patent Application PCT/US2023/010630, mailing date Jun. 27, 2023, 18 pages, International Searching Authority (US).

Pradipta, Geraldo, et al., "A Machine Learning Based Parasitic Extraction Tool," Oct. 31, 2019, 3 pages, University of Minnesota, Minneapolis, Minnesota, USA.

Ren, Haoxing (Mark), "Machine Learning and Deep Learning Applications in Design Automation and Practical Issues," DAC '19: 56th Annual Design Automation Conference 2019, Jun. 2-6, 2019, 55 pages, Association for Computing Machinery, Las Vegas, Nevada, USA.

Ronneberger, Olaf, et al., "U-Net: Convolutional Networks for Biomedical Image Segmentation," May 18, 2015, 8 pages, retrieved from https://arxiv.org/pdf/1505.04597.pdf.

Shi, Xuelong, et al., "Physics based feature Vector Design: a Critical Step Towards Machine Learning based Inverse Lithography," SPIE Proceedings 11327, Optical Microlithography XXXIII, Mar. 23, 2020, 8 pages, vol. 113270A, SPIE, San Jose, California, USA.

Sole, Marc Pons, "Layout Regularity for Design and Manufacturability," Doctoral Thesis, Jul. 8, 2012, 185 pages, Technical University of Catalonia, Barcelona, Spain.

Sperling, Ed, "Design Rule Complexity Rising," Semiconductor Engineering—Deep Insights for the Tech Industry, Apr. 19, 2018, 16 pages, SMG, retrieved from https://semiengineering.com/design-rule-complexity-rising/.

Srivastava, Navin, et al., "Interconnect Challenges for Nanoscale Electronic Circuits," JOM: The Journal of the Minerals, Metals & Materials Society, Oct. 2004, 2 pages, vol. 56, Issue 10, Silicon Nanoelectronics, retrieved from https://link.springer.com/article/10.1007/s11837-004-0285-1.

Teig, Steven L., "The X architecture: not your father's diagonal wiring," SLIP '02: Proceedings of the 2002 international workshop on System-level interconnect prediction, Apr. 6, 2002, 5 pages, ACM, retrieved from https://dl.acm.org/doi/10.1145/505348.505355.

Wang, Shibing, et al., "Efficient Full-Chip SRAF Placement Using Machine Learning for Best Accuracy and Improved Consistency," SPIE Proceedings 10587, Optical Microlithography XXXI, Mar. 20, 2018, 10 pages, vol. 105870N, SPIE, San Jose, California, USA.

Wang, Shibing, et al., "Machine Learning Assisted SRAF Placement for Full Chip," SPIE Proceedings 10451, Photomask Technology 2017, Oct. 16, 2017, 8 pages, vol. 104510D, SPIE, Monterey, California, USA.

Yang, Dingcheng, et al., "CNN-Cap: Effective Convolutional Neural Network Based Capacitance Models for Full-Chip Parasitic Extraction," Jul. 14, 2021, 9 pages, retrieved from https://arxiv.org/pdf/2107.06511.pdf.

(56) References Cited

OTHER PUBLICATIONS

Jhaveri, Tejas K., et al., "Maximization of layout printability/manufacturability by extreme layout regularity," Journal of Micro/Nanolithography, MEMS, and MOEMS, Jul. 1, 2007, 3 pages, vol. 6, Issue 3, SPIE.

Jhaveri, Tejas, et al., "Co-Optimization of Circuits, Layout and Lithography for Predictive Technology Scaling Beyond Gratings," IEEE Transactions on Computer-Aided Design of Integrated Circuits and Systems, Apr. 2010, 3 pages, vol. 29, No. 4, IEEE.

Dong, Xuan, et al., "Process-Variation-Aware Rule-Based Optical Proximity Correction for Analog Layout Migration," IEEE Transactions on Computer-Aided Design of Integrated Circuits and Systems, vol. 36, No. 8, Aug. 1, 2017, pp. 1395-1405, IEEE.

Elsemary, Ahmed Mounir, et al., "Litho Friendly Via insertion with In-Design Auto-Fix flow using Machine Learning" Proceedings of SPIE, vol. 10588, Design-Process-Technology Co-optimization for Manufacturability XII, Apr. 4, 2018, 11 pages, SPIE, San Jose, California.

Extended European Search Report of Commonly Owned European Patent Application 23743617.5, mailing date Dec. 8, 2025, 10 pages, European Patent Office.

Kareem, Pervaiz, et. al., "Fast Prediction of Process Variation Band through Machine Learning Models," Optical Microlithography XXXIV, Feb. 2021, vol. 11613, 8 pages, Proceedings of SPIE—The International Society for Optical Engineering.

Shao, Dongbing, et al., "Incorporating Process Variation Contours in Design Rule Calculation and SRAM Design Optimization", Proceedings of SPIE, vol. 10962, Design-Process-Technology Co-optimization for Manufacturability XIII, Mar. 20, 2019, 7 pages, SPIE, San Jose, California.

Shao, Hao-Chiang, et al., "From IC Layout to Die Photograph: A CNN-Based Data-Driven Approach" IEEE Transactions on Computer-Aided Design of Integrated Circuits and Systems, vol. 40, No. 5, May 2021, pp. 957-970, IEEE.

Watanabe, Yuki, et al., "Accurate Lithography Simulation Model based on Deep Learning" Institute of Electronics, Information, and Communication Engineers (IEICE) Technical Report, Nov. 2016, vol. 116, No. 330, pp. 73-78.

* cited by examiner

1206

2300

| X (nm) | Y (nm) | Comment |
|--------|--------|---------|
| 0 | 2 | North (N) |
| 2 | 0 | East (E) |
| 0 | -2 | South (S) |
| -2 | 0 | West (W) |

| X (nm) | Y (nm) | Comment |
|--------|--------|---------|
| 2 | 2 | NorthEast (NE) |
| 2 | -2 | SouthEast (SE) |
| -2 | -2 | SouthWest (SW) |
| -2 | 2 | NorthWest (NW) |

| X (nm) | Y (nm) | Comment |
|---|---|---|
| 0 | 2 | North (N) |
| 2 | 2 | NorthEast (NE) |
| 2 | 0 | East (E) |
| 2 | -2 | SouthEast (SE) |
| 0 | -2 | South (S) |
| -2 | -2 | SouthWest (SW) |
| -2 | 0 | West (W) |
| -2 | 2 | NorthWest (NW) |

*Figure 25*

Frame Interval (ms) 500

☐ Include Non-Clipping Events

☑ Generate Annotations Highlighting Clipping Events

☑ Include Perfectly Aligned Baseline Reference Events

Contours to Include in Animation Sequence

☑ Inner

☐ Nominal

☐ Outer

COMPUTING AND DISPLAYING A PREDICTED OVERLAP SHAPE IN AN IC DESIGN BASED ON PREDICTED MISALIGNMENT OF METAL LAYERS

CROSS REFERENCE TO RELATED APPLICATIONS

The present application is related to the following applications having a similar specification and figures: U.S. patent application Ser. No. 17/992,897, filed Nov. 22, 2022; U.S. patent application Ser. No. 17/992,906, filed Nov. 22, 2022; and U.S. patent application Ser. No. 17/992,907, filed Nov. 22, 2022.

BACKGROUND

Some of the biggest challenges in chip scaling involve contacts and interconnects. Since interconnects become more compact at each process node, this has an adverse effect on RC (resistance-capacitance) delay (and hence timing, max operating frequency, etc.) in integrated circuit (IC) designs. Transistor devices have traditionally scaled well, e.g., with the translation from planar to fin field-effect transistor (FinFET) devices. However, the contacts and interconnects have shrunk as the devices have shrunk, which leads to significant increase in resistance.

FIG. 1 illustrates an example of an interconnect 102, a contact 104 and a transistor 106 at various nodes. Transistor devices (Front-End-of-LINE FEOL devices) and IC interconnects Back End Of Line (BEOL) are connected by a contact layer called the middle-of-line (MOL), in which contacts are formed. Contacts are three-dimensional structures with a small gap, which is typically filled with a conductive material, such as tungsten. The tungsten structure, called a tungsten plug, is sandwiched between a liner material (titanium) and a barrier layer (titanium nitride). The entire structure is called a contact.

At 16 nm/14 nm process nodes, the volume of the tungsten conductor material is relatively small. Hence, an electrical signal flows through the relatively smaller amount of conductive metal, causing a significant increase in contact resistance. The electrical resistance of an object is a measure of its opposition to the flow of electric current and so relates to the difficulty to pass a current through a conductor (such as a contact). Contact resistance has become more problematic at each process node.

Interconnects are structures that connect two or more circuit elements (such as transistors) together electrically. Modern integrated circuits at the leading edge process geometries now have in the range of 9 to 12 metal (copper) layers, if not more. Each layer contains a number of wire structures, and wires on different layers are electrically connected with vias.

FIG. 2 illustrates several examples of interconnect layers 200. Copper interconnects in IC designs are commonly fabricated using a dual damascene process in which a low-k dielectric material is deposited on the surface of the device. The low-k dielectric material insulates one device layer from another. After this, the vias and trenches are patterned and the resulting structure is etched, forming a via and trench. FIG. 3 illustrates an example of a dual-damascene fabrication process 300 with the etched via 302 and trench 304.

FIG. 4 illustrates an example of interconnect line widths 400 that have had to scale in size as transistor sizes have shrunk in modern processes. This has led to substantially increased resistance value (towards the left side of the graph in the figure). Over the last decade or more, interconnect dimensions have continued to scale along with the transistor devices, leading to an increase in overall wire length (a multi-fold increase since the 90 nm node) coupled with increases in resistance and capacitance from increasingly closely spaced, thin wires. Foundries have been able to reduce the contribution to RC delay from resistance by increasing the aspect ratio (effectively, the height) of the interconnect (with a resulting increase in coupling capacitance), but resistance has become an increasingly difficult problem to solve.

FIG. 5 illustrates an example of BEOL performance/area/cross scaling being the foremost issue for 10 nm/7 nm process nodes and the difficulty at various process nodes. Smaller process nodes are represented to the right, and the y-axis is drawn on a log scale. FIG. 5 illustrates how the interconnect RC delay has increased by multiple orders of magnitude, even as the transistor delay has decreased by less than a single order of magnitude, from 90 nm process down to 7 nm processes.

A large portion of the RC delay can be attributed to via resistances, and via resistances significantly increase as wire widths decrease. FIG. 6 illustrates an example of a relationship between via resistance for both standard and chamfered vias, as a function of the critical dimension for a metal layer.

A key goal in IC manufacturing is to align the various layers of a wafer in a precise manner, which represents good overlay. For example, a transistor gate on one layer needs to be connected through a contact in another layer and to an interconnect wire in another layer. They all have to be lined up on top of each other. Since such alignment is not perfect in true manufacturing processes, there is tolerance built into the design rules both geometrically and in the performance characteristics. To scale standard cells smaller with each node, overlay accuracy (alignment) also needs to scale along with the feature sizes. Metrology system vendors ASML and KLA-Tencor recently introduced new overlay metrology systems, seeking to address the increasing precision required for lines, cuts and other features on each layer. At 10/7 nm, there are 80 or more masking layers, compared with 40 layers at 28 nm. If those masking layers are not precisely measured, the features being patterned, deposited and etched may not line up from one layer to the next. The job of the overlay metrology system is to detect unwanted shifts in position between the layers, as well as process variations. This is a critical measurement, as overlay mishaps can impact the performance and yield of a chip, as well as its reliability in the field. At each new node however, the alignment process is much more difficult. Even with such recent advances in metrology systems, overlay/misalignment issues still persist in IC manufacturing today.

Multi-patterning for the smaller geometry processes has made the overlay/alignment problem even more severe. Many of the most difficult alignment challenges exist where layers (masks) need to align to self-aligned quadruple patterning (SAQP) with lower levels in the interconnect stack. The very small pitches of SAQP layers have increased the challenge of aligning an edge of a higher interconnect level to those lower level pitches. This complex process has significantly increased in difficulty as processes scale from 7 nm to 5 nm.

Via resistances can further increase as a function of such process layer misalignment, unless specific steps are taken to oversize the vias. For non-oversized vias, the via resistance increases due to misalignment can be as much as 150%. With oversized vias, the via resistance increases can be reduced to 10-20%, but it is still not zero.

In addition to contact and via resistance issues which may affect IC performance (e.g. max operating frequency), via misalignment issues lead to problems with reliability. The reduction of the via contact area to the connected metal line may degrade electromigration (EM) lifetime because of the local current density increase (the current density increases as via overlap areas decrease).

Design rules have become more stringent and complex (as shown in FIG. 7) to try to mitigate the issues described above. Even with design rules offering some degree of protection, there is a need for IC designers to be able to visualize and understand interconnect resistance and reliability issues in the context of their specific IC design. In design-rule-exempt scenarios, if the designers could have a true visualization of the actual overlaps on a per-via instance basis, they can be in a position to modify the design layout to improve many of these issues, leading to higher performance designs, improved reliability, or both.

General-purpose IC design rules have to be somewhat pessimistic/conservative in nature, in order to cater to a wide variety of designs, as it is not known a priori what polygons will neighbor other polygons during an IC layout, and so the rules have to be able to accommodate just about every possibility.

Standard cell designers (e.g., SRAM designers) on the other hand have traditionally been able to take advantage of "DRC exemptions" due to the extreme regularity of their designs (e.g., each SRAM cell is surrounded in all directions by identical cells or close-to-identical dummy cells at the periphery of the memory array). This regularity means that it is known a priori what polygons neighbor other polygons, and so the rules can be 'relaxed' somewhat, allowing for a denser packing of polygons compared to that allowed for by the restrictive rules. Packing a cell tighter is more meaningful when it is repeated many times, so these exemptions are often negotiated between a designer and a foundry/fab. Even very small decreases in bit-cell (or any other type of cell used in a highly repetitive manner, such as Standard Cell Library cells) area can lead to exceptionally large improvements in chip density and area decrease at the chip level. Efforts have also been made in other design areas in the past to use DRC exemptions in conjunction with regularly structured designs/fabrics resulting in improved packing density, and/or improved manufacturing yield. Here, the regularity enforced by the design fabric has resulted in the relaxing of the design rule constraints somewhat. However, this approach is somewhat inflexible, as it requires an imposed significant regularity of the design fabric, and so reduces design and layout engineer choices.

SUMMARY

Some embodiments provide a method for computing and displaying of minimum overlap for semiconductor layer interfaces, such as metal-via and metal-contact. The method leverages a machine-trained network (e.g., a trained neural network) to quickly, but accurately, infer the contours for the manufactured shapes across a range of process variations. The method also models the semiconductor process manufacturing layer-to-layer misalignment. The combined set of information (from the machine-trained network and from the modeling) is used by the method to compute the minimum overlap shapes at multiple layer interfaces. The method in some embodiments then uses the minimum overlap shapes to obtain an accurate calculation of the via or contact resistance.

The method of some embodiments also aids the IC designer in gaining an intuitive understanding of exactly how the final overlap shapes are reached. The method of some embodiments provides a passive animation scheme that is presented in a video file playback-like manner. Conjunctively, or alternatively, the method of some embodiments provides a dynamic animation scheme that is also presented in a video-like manner but in which a layout editor (e.g., a router) itself is used to dynamically display an animation, while allowing the user to continue to operate the layout editor to perform operations (e.g., design edit operations, view operations such as zoom and pan) to shapes of interest for example.

The method of some embodiments augments the animations with a baseline of perfectly aligned images in between the misaligned images (e.g., overlays the animation on top of the IC design layout defined by the layout editor), to provide a static visual frame of reference to allow the details of the animations to be better absorbed by the layout engineer. The animations allow the layout engineer to visualize the effects of process manufacturing layer misalignment at the same time as visualizing the manufactured process wafer contours in a variation-aware manner, and aid in intuitively understanding how the minimum overlap shapes are obtained.

Due to the dynamic nature in which computed shapes are scheduled and redrawn by the layout editor, the method of some embodiments can redraw shapes at the same level of granularity as the design shapes, even when highly zoomed in at low zoom altitude levels, offering the designer the clearest images. The method of some embodiments also provides several higher level layout editing tasks that leverage the computations to optimize the layout for improved overlap area, reduced metal-via and metal-contact resistance, and improved long term reliability. The method uses highly parallel compute architecture (such as Graphics Processing Units (GPU) and Tensor Processing Units (TPU)), which improves throughput compared to traditional means.

The method of some embodiments provides a layout designer with sufficient information to visualize contact and via overlap on a per-contact or per-via basis, so as to be able to modify the layout to further improve overlap and minimize resistance. The method also extends the concept and application of DRC-exempt design to more arbitrary design scenarios (for example, custom IC design), during design layout time, effectively simplifying design rules for the layout designer, and improving the resulting design yield and manufacturability. Some embodiments achieve this without compromising layout flexibility, i.e., without forcing the layout designer to use a small number of predefined layout templates.

Some embodiments use machine learning processes (to present the designer with a 'WYSIWYG' (What You See Is What You Get) paradigm for contact/via and metal overlap. These embodiments allow for interactive design updates, while visualizing in real time the expected manufactured silicon results. In particular, some embodiments use the machine trained neural network to predict the shape of the wafer contours for metal, contact and via shapes, along with their process variations (inner and outer contours) after a particular manufacturing stage of a manufacturing process that is used to manufacture an IC based on the design layout.

Combining such machine-trained networks along with the other described aspects of the method of some embodiments allows the IC designs to be computed with minimum contact-metal or via-metal overlap areas in the presence of both process variations and mask misalignments during semiconductor fabrication. The method of some embodiments presents the minimum overlap areas to a circuit designer in the context of the circuit design itself, and within the tool used to create the circuit design. Furthermore, to allow the designer to understand how the minimum overlap area is obtained in the context of a specific integrated circuit design, the method of some embodiments allows the designer to make layout modifications specific to that design to improve the minimum overlap area, and thus reduce contact-metal or via-metal resistance values, improving operating frequency and also improving reliability. By furnishing the designer with sufficient information, the method allows the designer to locally optimize contacts and vias on a per-contact or per-via instance basis by layout modification, as a function of the surrounding design shapes.

One of ordinary skill will realize that other embodiments are implemented differently. For instance, some embodiments do not use machine-trained networks to produce the contours for the manufactured shapes across a range of process variations but rather generate these contours through other programmatic or algorithmic manners. Others only model the semiconductor process manufacturing layer-to-layer misalignment in the predicted overlapping shapes that they present without accounting for the contour variations that are due to the manufacturing process variations. Alternatively, still other embodiments do not account for the layer-to-layer misalignment in the predicted overlapping shapes but rather only account for the contour variations that are due to the manufacturing process variations.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed. Moreover, the claimed subject matters are not to be limited by the illustrative details in the Summary, Detailed Description and the Drawings.

BRIEF DESCRIPTION OF FIGURES

The novel features of the invention are set forth in the appended claims. However, for purposes of explanation, several embodiments of the invention are set forth in the following figures.

FIGS. 23-25 illustrate tables listing misalignment translations applied to each layer in some embodiments.

FIG. 37 conceptually illustrates an electronic system with which some embodiments of the invention are implemented.

DETAILED DESCRIPTION

Figure 1:
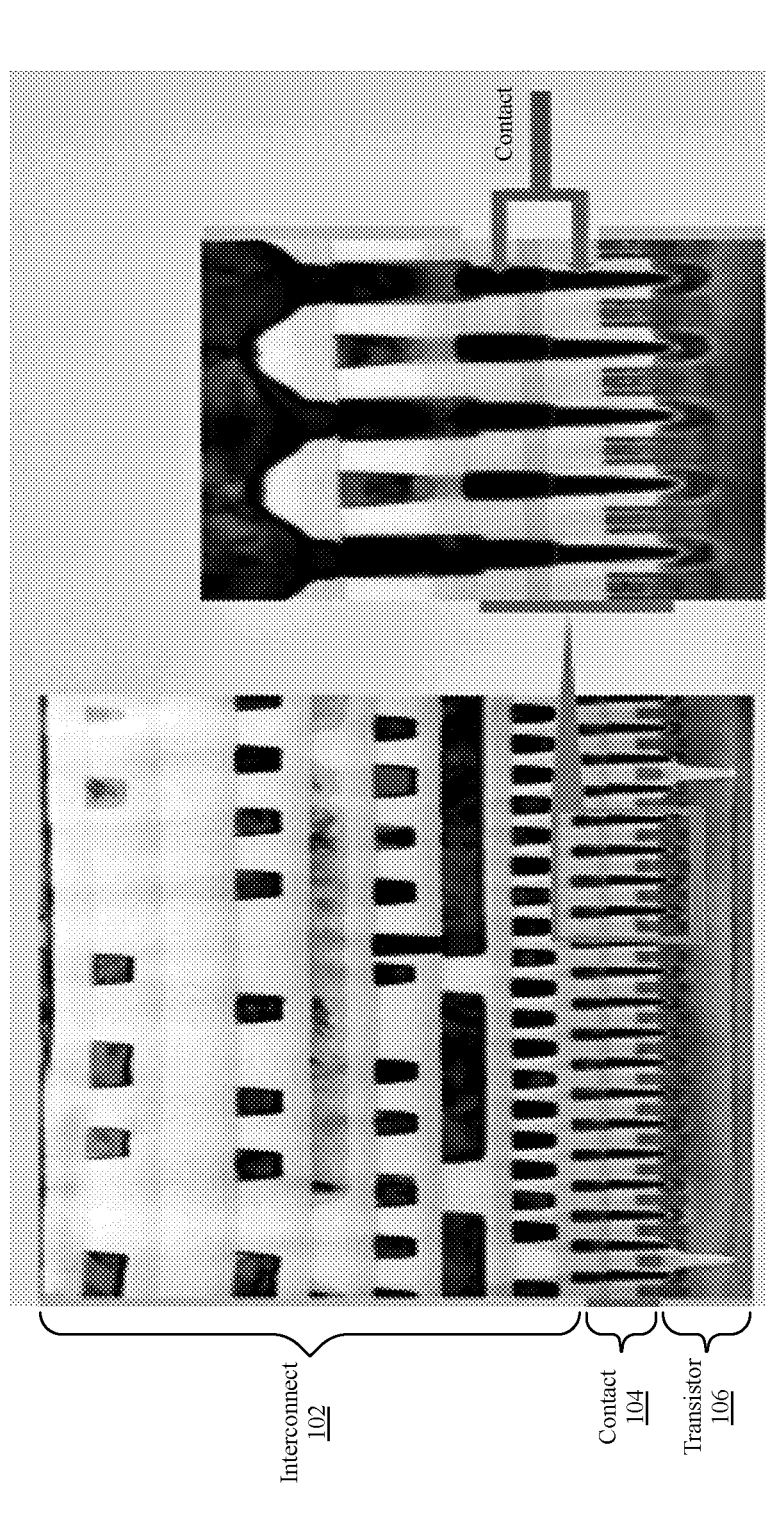
FIG. 1 illustrates an example of an interconnect, a contact and a transistor at various nodes.
Figure 2:
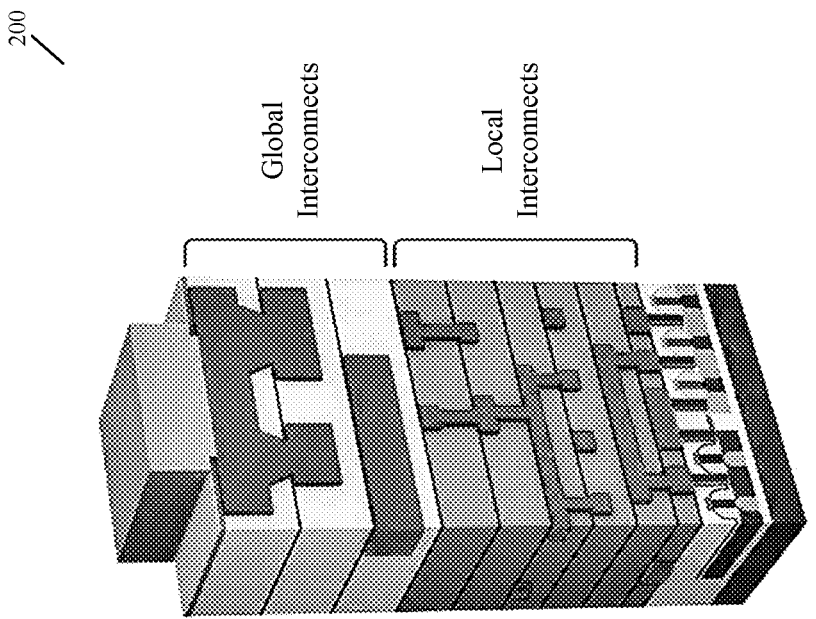
FIG. 2 illustrates several examples of interconnect layers.
Figure 2:
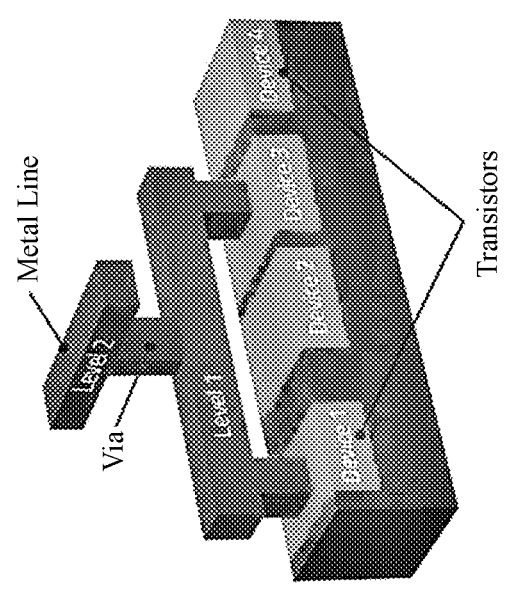
Figure 3:
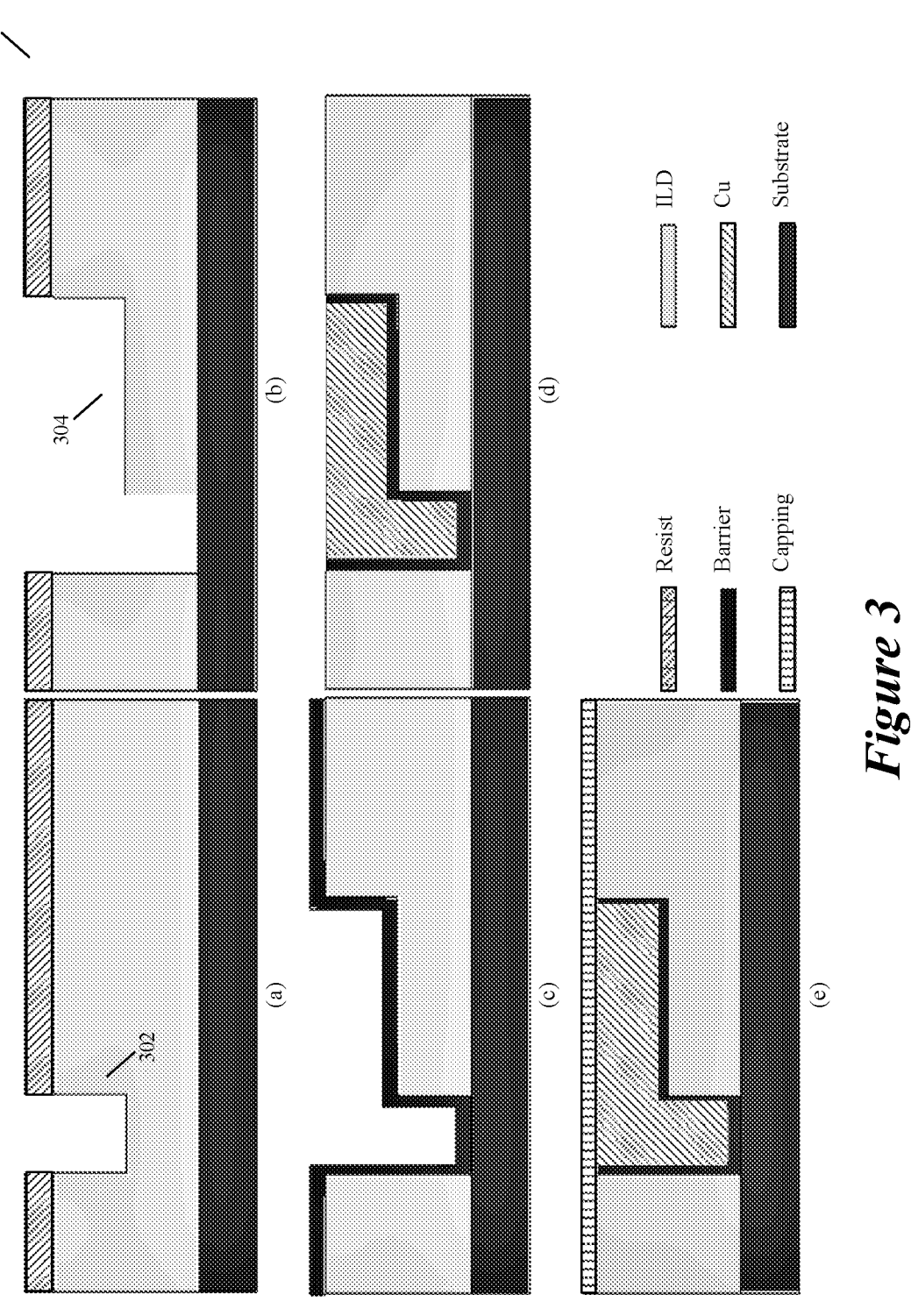
FIG. 3 illustrates an example of a dual-damascene fabrication process with an etched via and trench.
Figure 4:
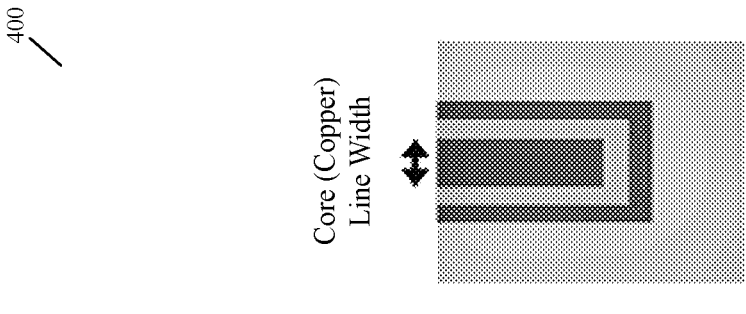
FIG. 4 illustrates an example of interconnect line widths that have had to scale in size as transistor sizes have shrunk in modern processes.
Figure 4:
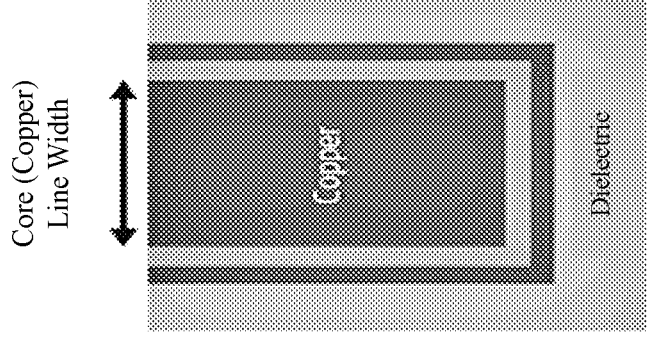
Figure 4:
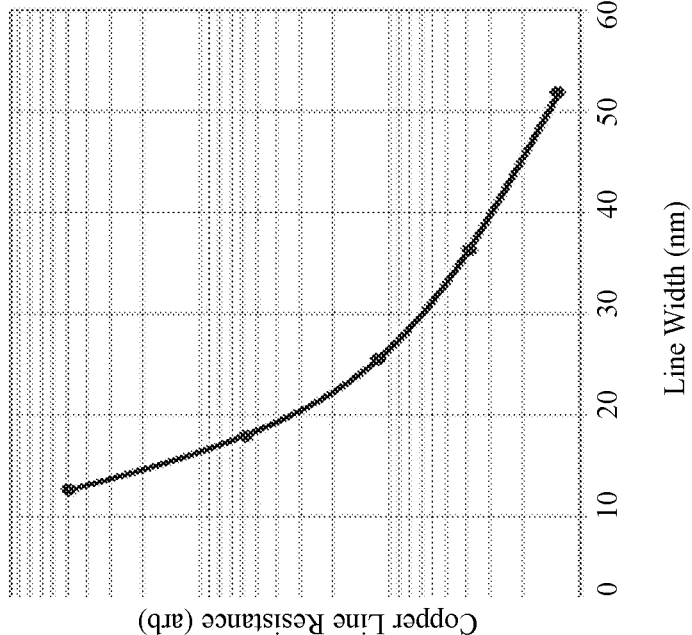
Figure 5:
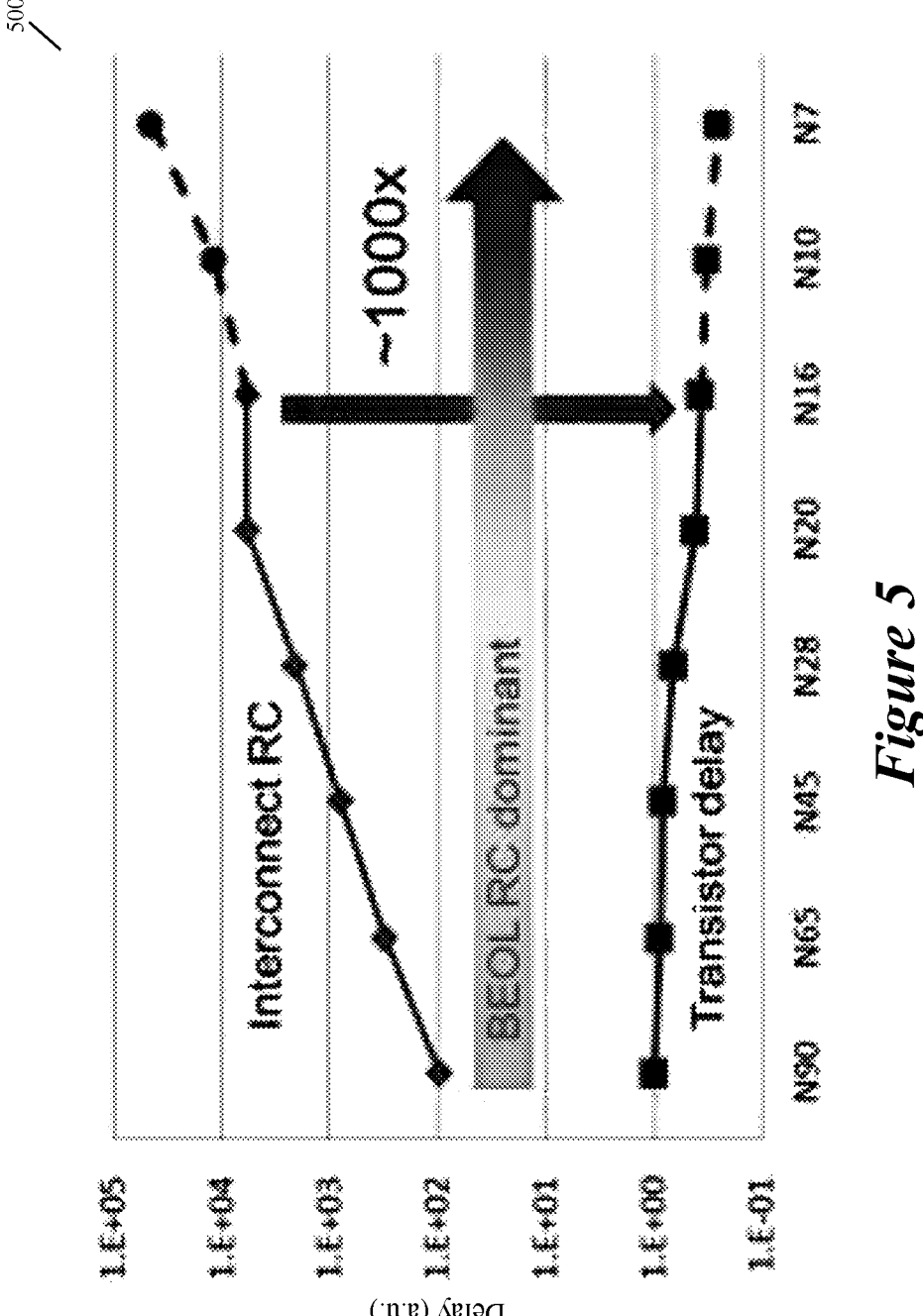
FIG. 5 illustrates an example of BEOL performance/area/cross scaling being the foremost issue for 10 nm/7 nm process nodes and the difficulty at various process nodes.
Figure 6:
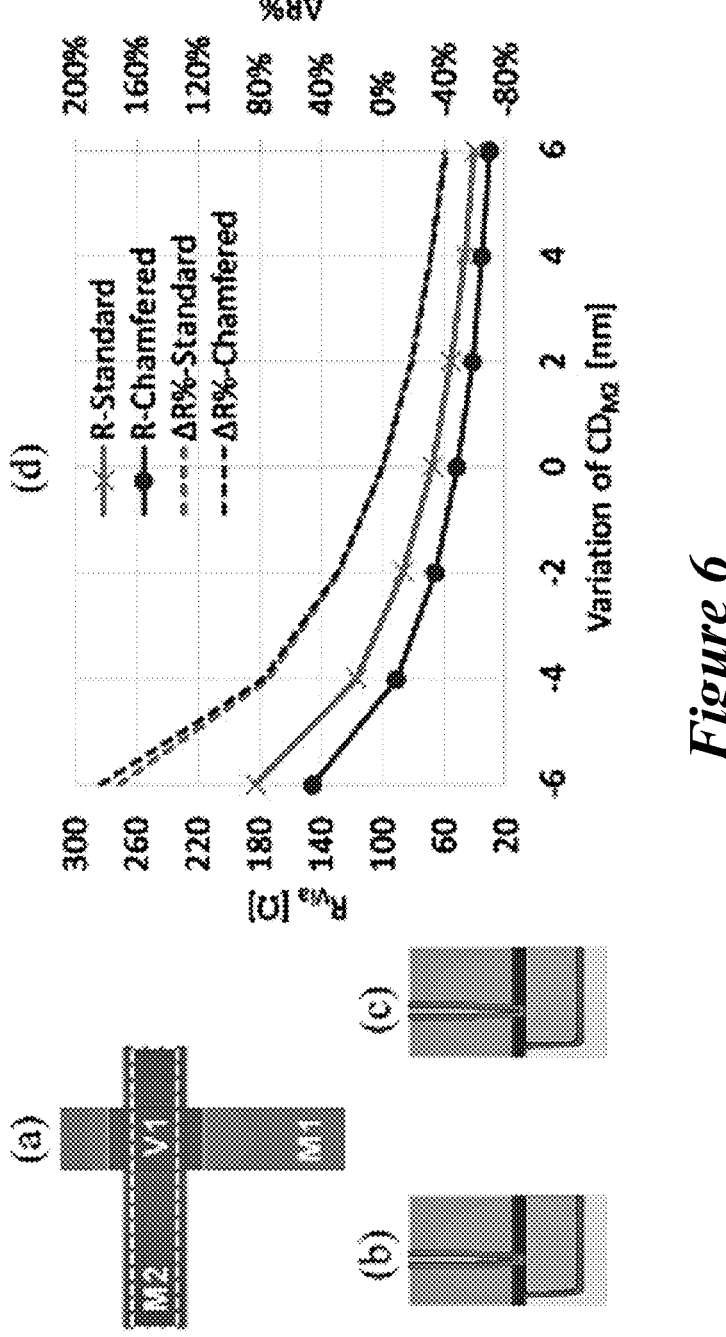
FIG. 6 illustrates an example of a relationship between via resistance for both standard and chamfered vias, as a function of the critical dimension for a metal layer.
Figure 7:
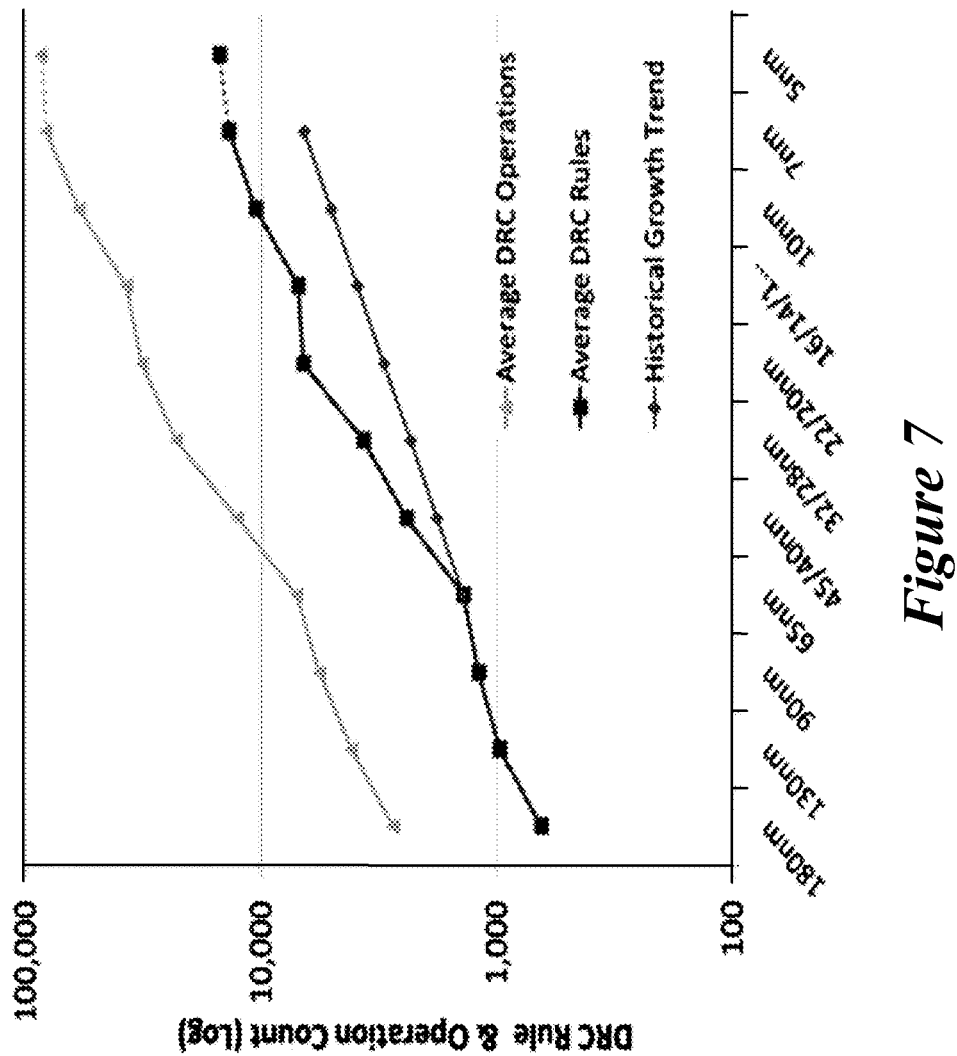
FIG. 7 illustrates the growth of design rules.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments provide a method for computing and displaying of minimum overlap for semiconductor layer interfaces, such as metal-via and metal-contact. The method uses a machine-trained network (e.g., a trained neural network) to quickly, but accurately, produce multiple contours for the manufactured shapes across a range of process variations. The method also models the semiconductor process manufacturing layer-to-layer misalignment. The combined set of information (from the machine-trained network and from the modeling) is used by the method to compute the minimum overlap shapes at multiple layer interfaces. The method in some embodiments then uses the minimum overlap shapes to obtain an accurate calculation of the via or contact resistance.

Some embodiments use machine learning processes (such as the deep neural network processes disclosed in U.S. Patent Publication 2022/0128899, which is incorporated herein by reference) to present the designer with a 'WYSI-WYG' (What You See Is What You Get) paradigm for contact/via and metal overlap. These embodiments allow for interactive design updates, while visualizing in real time the expected manufactured silicon results. In particular, some embodiments use the machine trained neural network (such as a neural network disclosed in U.S. Patent Publication 2022/0128899) to predict the shape of the manufactured wafer contours for metal, contact and via shapes, along with their process variations (inner and outer contours).

The predicted shapes of the contours represent the expected shapes of these contours after a particular manufacturing stage of a manufacturing process that is used to manufacture an IC based on the design layout. The particular manufacturing stage can be the stage resulting in the final manufactured IC, or an earlier stage, such as a wafer simulation stage, as further described in concurrently filed U.S. patent application Ser. No. 17/992,874, now issued as U.S. Pat. No. 12,547,803, entitled "Leveraging Concurrency to Improve Interactivity with an EDA Tool."

Combining such machine-trained networks along with the other described aspects of the method of some embodiments allows the IC designs to be computed with minimum contact-metal or via-metal overlap areas in the presence of both process variations and mask misalignments during semiconductor fabrication. The method of some embodiments presents the minimum overlap areas to a circuit designer in the context of the circuit design itself, and within the tool used to create the circuit design. Furthermore, to allow the designer to understand how the minimum overlap area is obtained in the context of a specific integrated circuit design, the method of some embodiments allows the designer to make layout modifications specific to that design to improve the minimum overlap area, and thus reduce contact-metal or via-metal resistance values, improving operating frequency and also improving reliability. By furnishing the designer with sufficient information, the method allows the designer to locally optimize contacts and vias on a per-contact or per-via instance basis by layout modification, as a function of the surrounding design shapes.

One of ordinary skill will realize that other embodiments are implemented differently. For instance, some embodiments do not use machine-trained networks to produce the contours for the manufactured shapes across a range of process variations but rather generate these contours through other programmatic or algorithmic manners. Others only model the semiconductor process manufacturing layer-to-layer misalignment in the predicted overlapping shapes that they present without accounting for the contour variations that are due to the manufacturing process variations. Alternatively, still other embodiments do not account for the layer-to-layer misalignment in the predicted overlapping shapes but rather only account for the contour variations that are due to the manufacturing process variations.

Before describing more detailed embodiments, the generation of multiple contours corresponding to multiple variations of a manufacturing process parameter will be explained. Most IC designs today are created with rectilinear shapes, using Manhattan routing, or occasionally 45 degree routing. When these designs are manufactured, the shapes deposited on the substrate are no longer Manhattan. In other words, the shapes deposited on the substrate during manufacturing become highly curvilinear due to the realities of manufacturing, particularly at modern process geometries.

Figure 8:
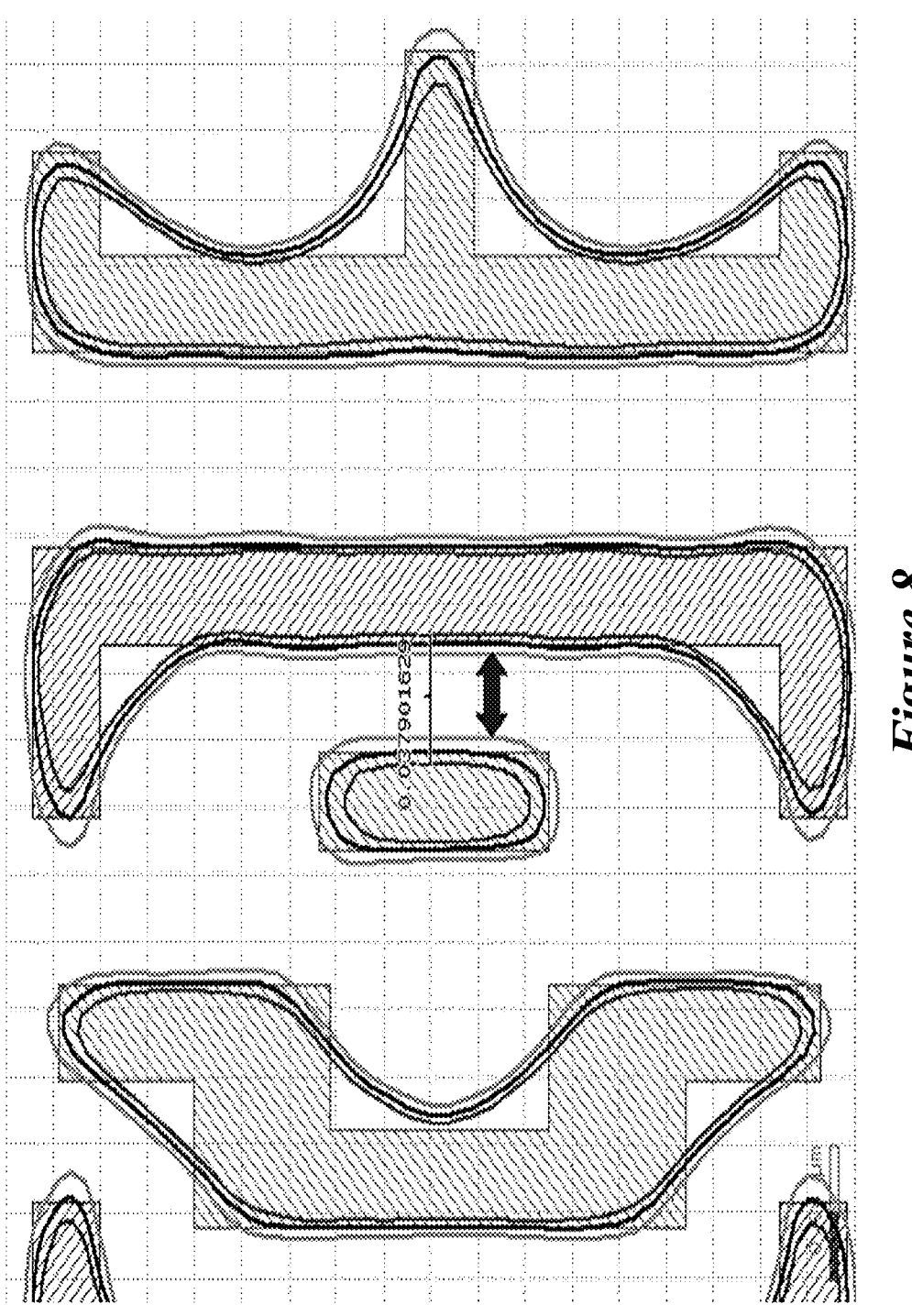
FIG. 8 illustrates an example of curvilinearization of Manhattan shapes by a manufacturing process.

FIG. 8 illustrates an example that shows rectilinear shapes being modeled by three sets of curvilinear contours, which in some embodiments are produced by one or more machine-trained networks. The rectilinear shapes in this example are identified by cross-hatched lines. In this example, the cross-hatched rectilinear/Manhattan shapes are overlaid with three sets of curvilinear lines that have three different appearances, such as three different colored contours (e.g., green for inner contours, dark blue for nominal contours, and purple for outer counters).

The cross-hatched rectilinear shapes represent different color masks for a metal layer, e.g., right-to-left cross hatching for the blue-color mask and left-to-right for the red-color mask. The three sets of curvilinear manufactured contours shown correspond to the one manufacturing process extreme (inner contour, e.g., for a maximum variation), to the nominal process conditions (nominal contour, e.g., for a nominal variation) and to another manufacturing process extreme (outer contour, e.g., for a minimum variation). The manufacturing process variations that result in multiple contours (inner, nominal, outer) combine with the process layer misalignment problem to make it difficult for a designer to understand how much actual via or contact overlap exists on a per-via or per-contact instance basis, and therefore difficult to anticipate how best to design the layout for maximum overlay, with minimum contact/via resistance, and best reliability. The generation of such contours through the use of a machine-trained network is further described in the above-incorporated U.S. Patent Publication 2022/0128899.

Figure 9:
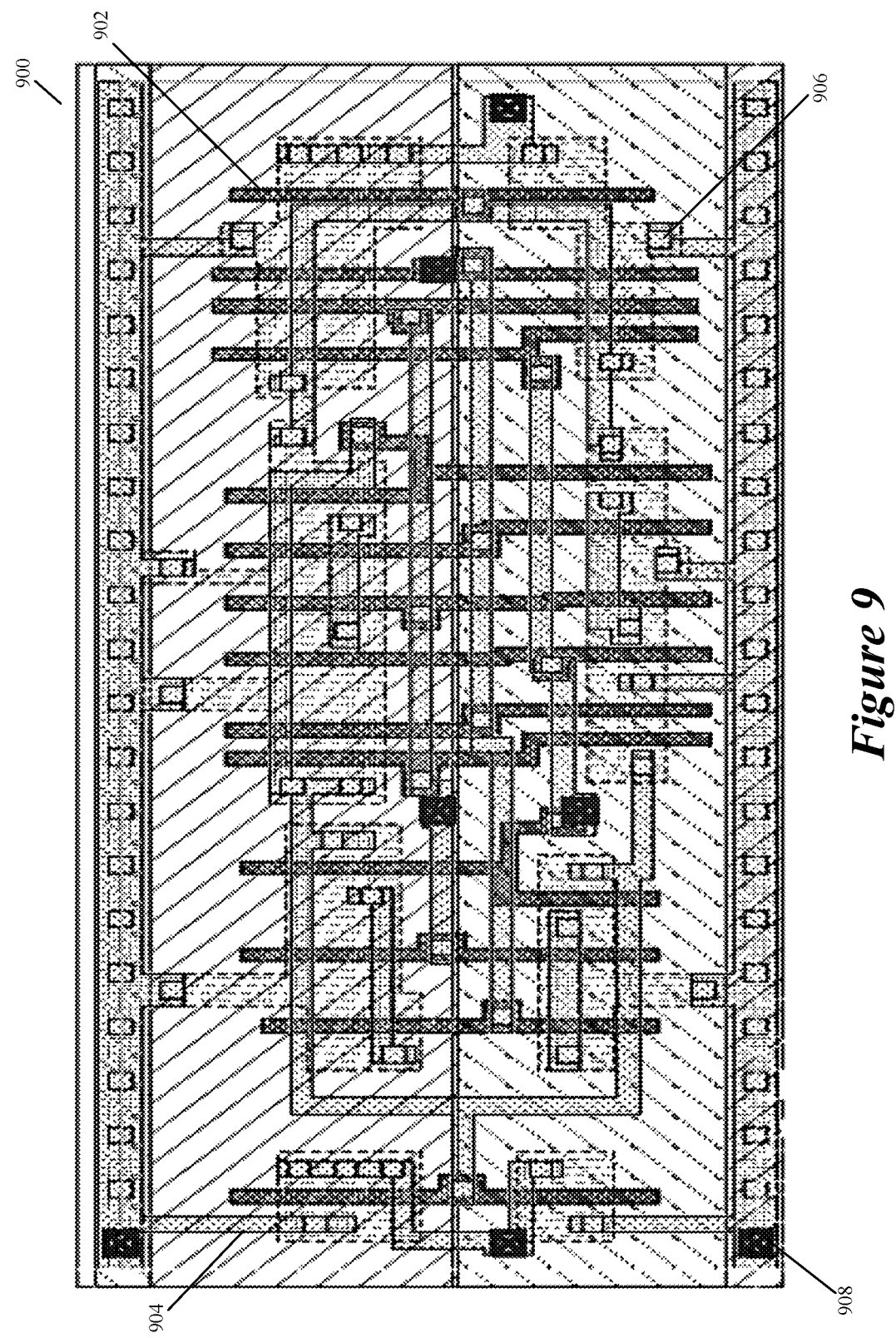
FIGS. 9-14 illustrate an example of multiple contours being produced and displayed for metal, contact and via shapes.

FIGS. 9-14 illustrate an example of multiple contours being produced and displayed for metal, contact and via shapes. This example refers to a standard cell 900 of FIG. 9. The standard cell 900 is from a standard cell library. The illustration in FIG. 9 presents multiple design layers (also called interconnect or metal layers) of an IC corresponding to multiple wiring layers (including the substrate layer) of the IC. As shown, the standard cell 900 includes a polysilicon layer 902 (displayed on a display screen in a first color, e.g., green), a metal layer 904 (displayed in a second color, e.g., dark blue), a contact layer 906 represented by the small squares, and a pin layer 908 (displayed in a different design, e.g., dark blue squares with an 'X' stipple). N implant and P implant layers are also visible in diagonal stipples and colors (displayed in a third and fourth color, e.g., orange and yellow).

Figure 10:
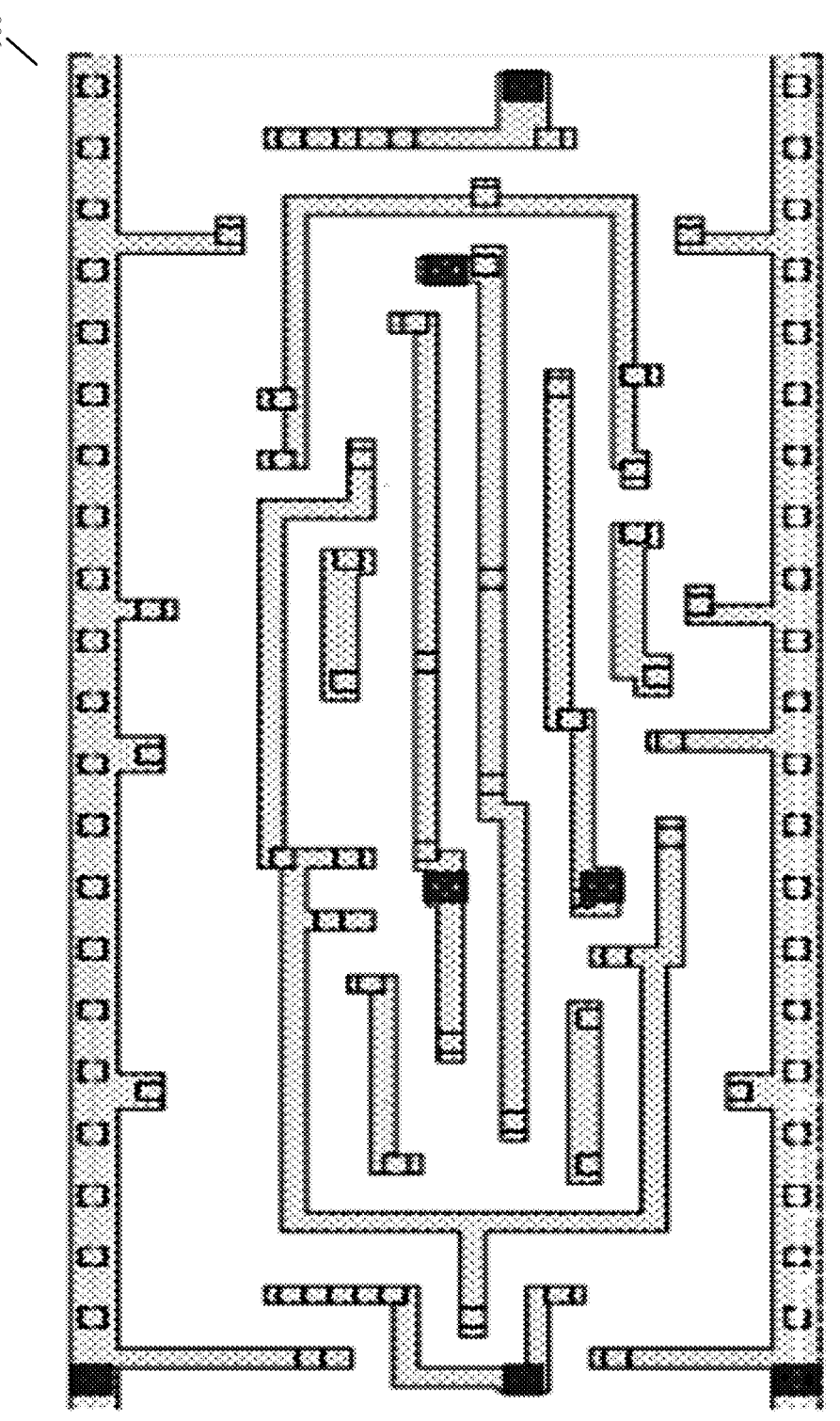

FIG. 10 illustrates the standard cell 900 showing metal, pin and contact layers only, in addition to cell boundary. The figure shows the same standard cell in which only a subset of layers (contact, metal and pin layers) are visible. The standard cell bounding box is also visible in a different color (e.g., in light blue). The focus of some embodiments is the interconnect stack, including contact layers where available.

Figure 11:
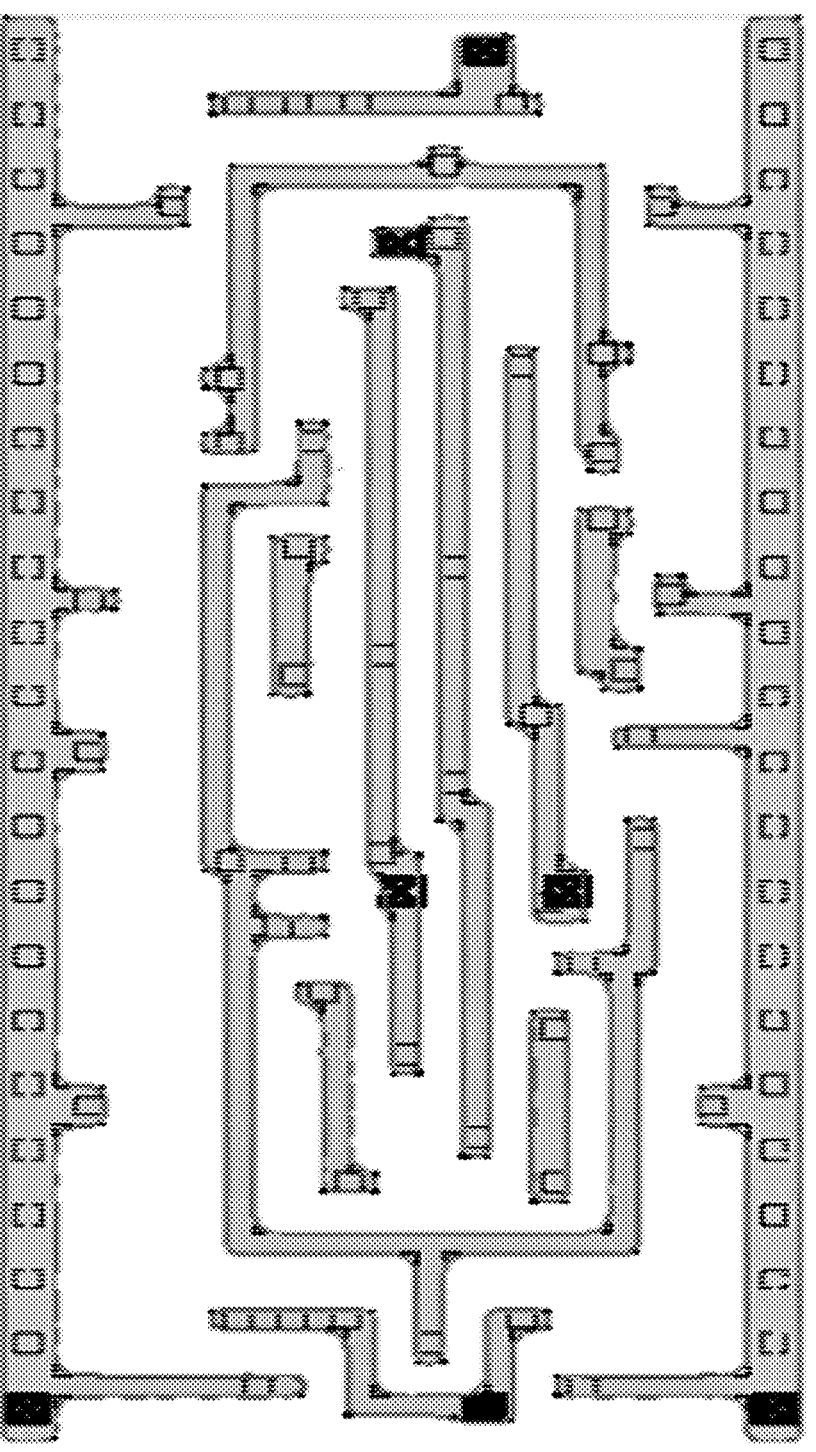

FIG. 11 illustrates an example of manufactured contours for the metal 1 layer of the standard cell design 900 superimposed above the design. Even at this high zoom level, it is apparent that the corners of the metal shapes have become rounded off during manufacturing, resulting in more complex shapes, compared with the purely rectilinear shapes in FIG. 10. While not apparent from this level of zoom, in some embodiments, there are three contours present in the image for each metal shape, corresponding to the inner, nominal and outer contours manufactured on silicon wafers. These inner, nominal and outer contours will become more apparent in later figures, where lower altitude zoom levels are deployed.

Figure 12:
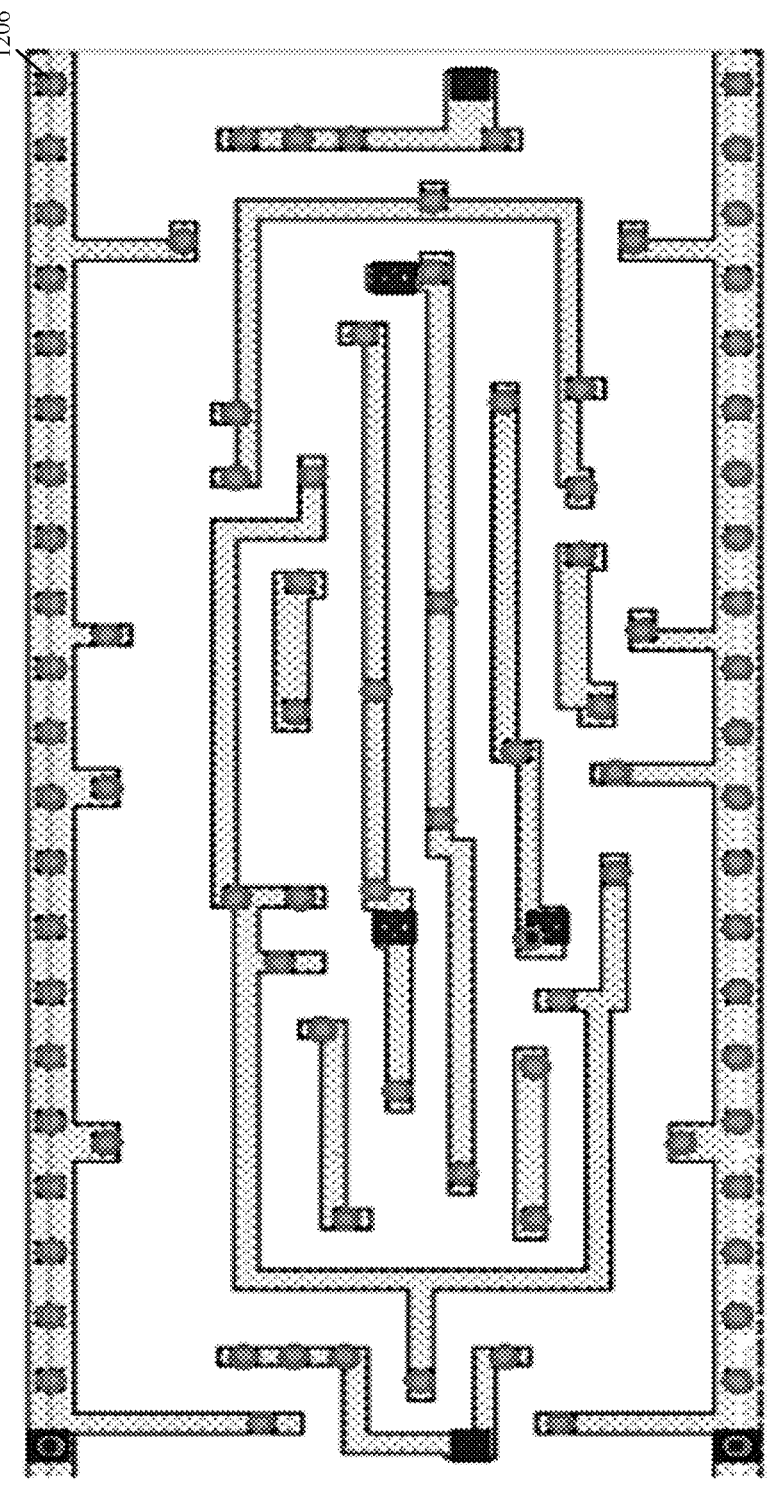

FIG. 12 illustrates an example of manufactured contours for the contact layer superimposed on the metal and contact layers of the standard cell design 900. The manufactured contours are shown as dark circles. Again, for this particular zoom level, the differentiation between the inner, nominal and outer contours is not clear, but will become apparent in later figures. The contact shapes 1206 in some embodiments are not manufactured as squares as originally drawn (e.g., in FIG. 10), but are instead manufactured with rounded corners leading to final shapes that appear to be circular (especially when the corners are heavily rounded). In this particular figure, the contours for the metal layer are not shown, and the rectilinear shapes of the designer-drawn layout are shown instead.

Figure 13:
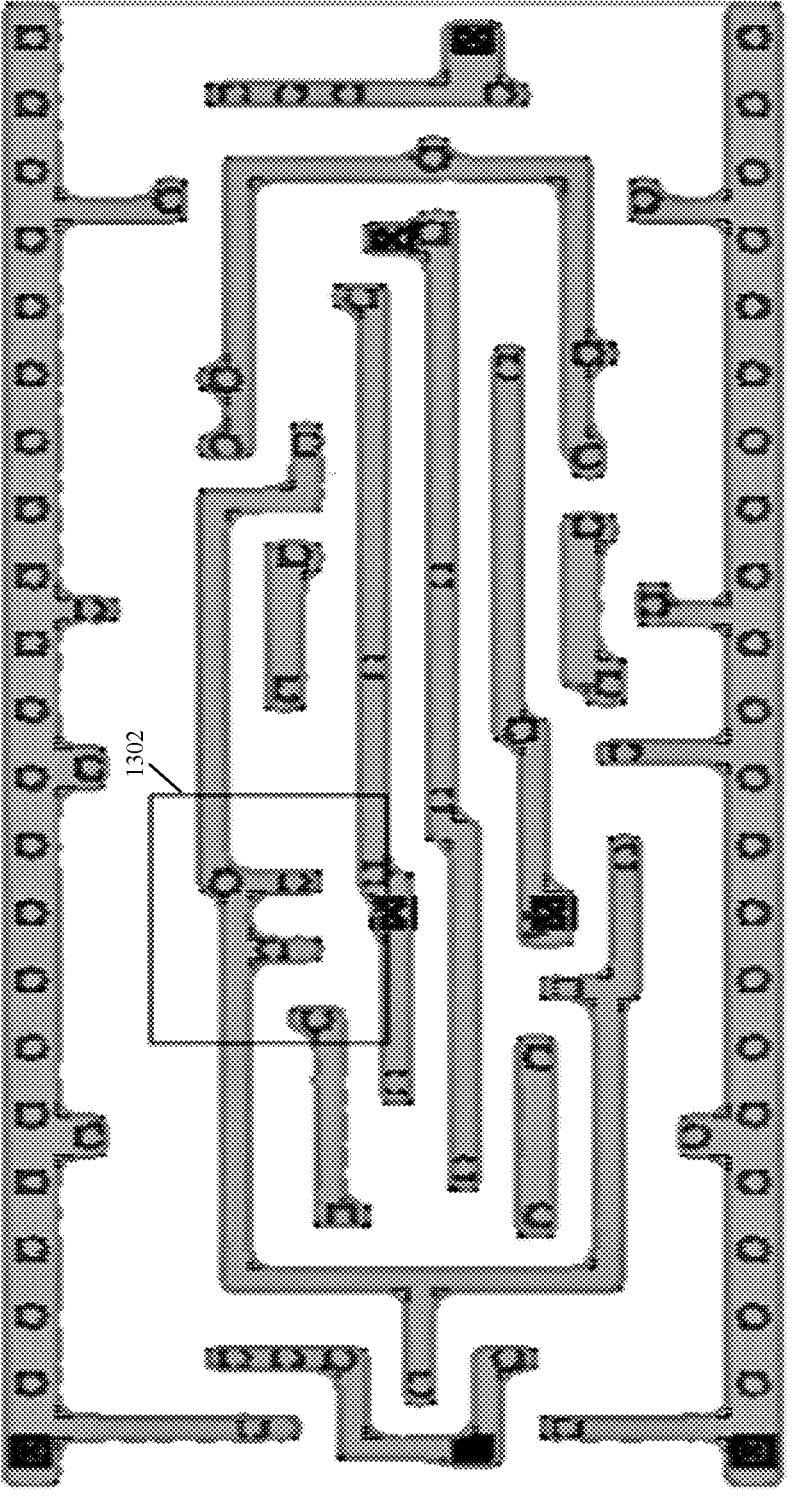

FIG. 13 illustrates an example of the manufactured contours for the metal 1 layer and the contact layers of the standard cell design, superimposed above the design. The manufactured shapes are again curvilinear, which is evident from the figure. As shown, the manufactured shapes for the contact and metal 1 layers are perfectly aligned with the original design shapes, and with each other, which is not reflective of the realities of manufacturing, in which such perfect alignment rarely occurs.

Figure 14:
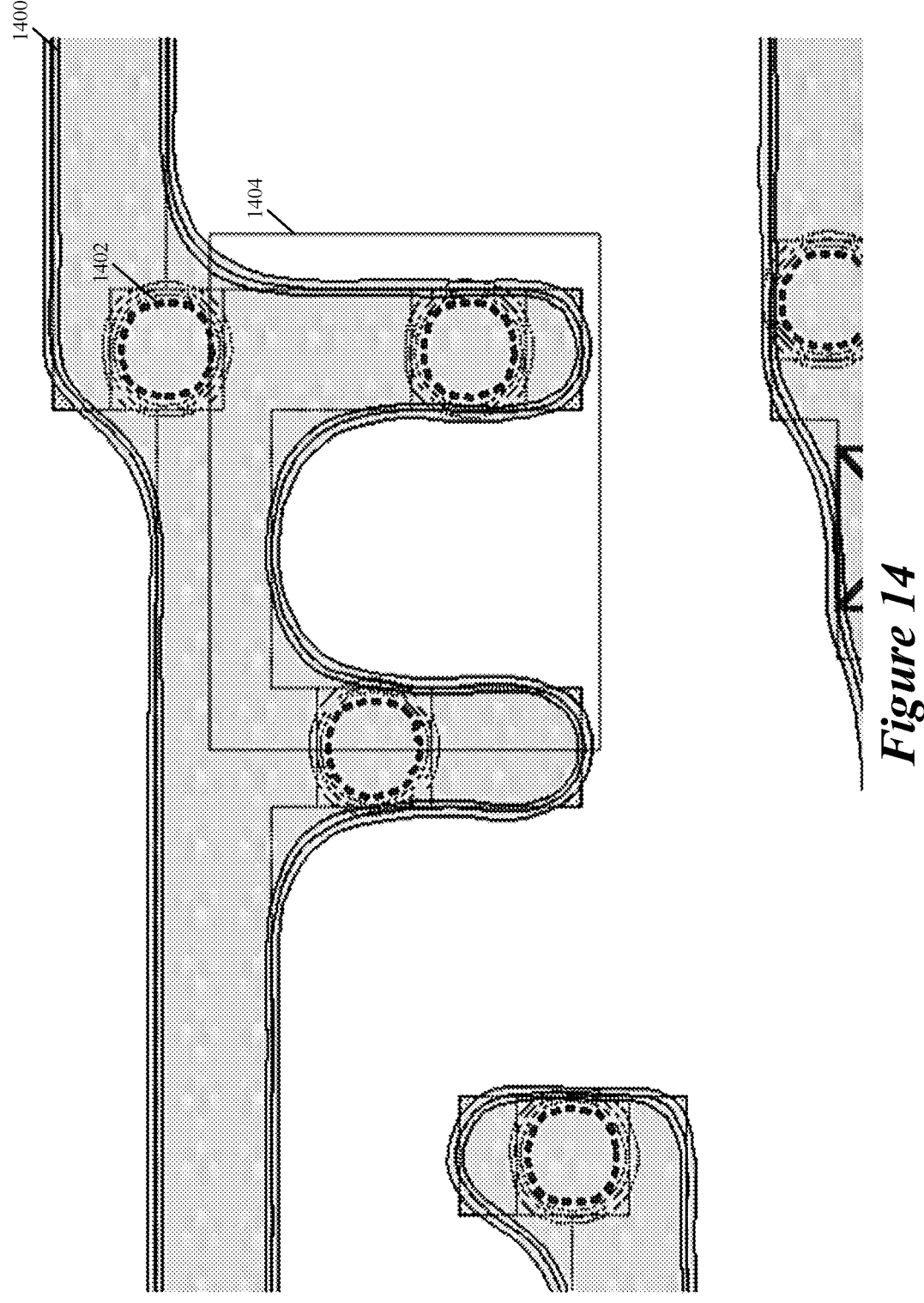

FIG. 14 illustrates a lower altitude zoomed-in view 1400 of a portion of the design corresponding roughly to the rectangular highlighted region 1302 in FIG. 13. Here, the inner, nominal, and outer contours for both the metal 1 and contact layer shapes are now visible as dashed lines with a thin line thickness. In some embodiments, the minimal overlap polygons 1402 for each metal/contact location are shown in thick, dashed lines. In some embodiments, contacts refer to the multi-layer interfaces that connect parts of circuit elements on the IC substrate with one or more lower metal layers (e.g., metal layer 1) to form circuit elements (e.g., to form transistors), vias refer to multi-layer interfaces that connect interconnect lines (e.g., lines representing wires) on different metal layers and higher layer interconnect lines to circuit elements, and metal refers to the interconnects that connect to the contacts or vias.

Figure 15:
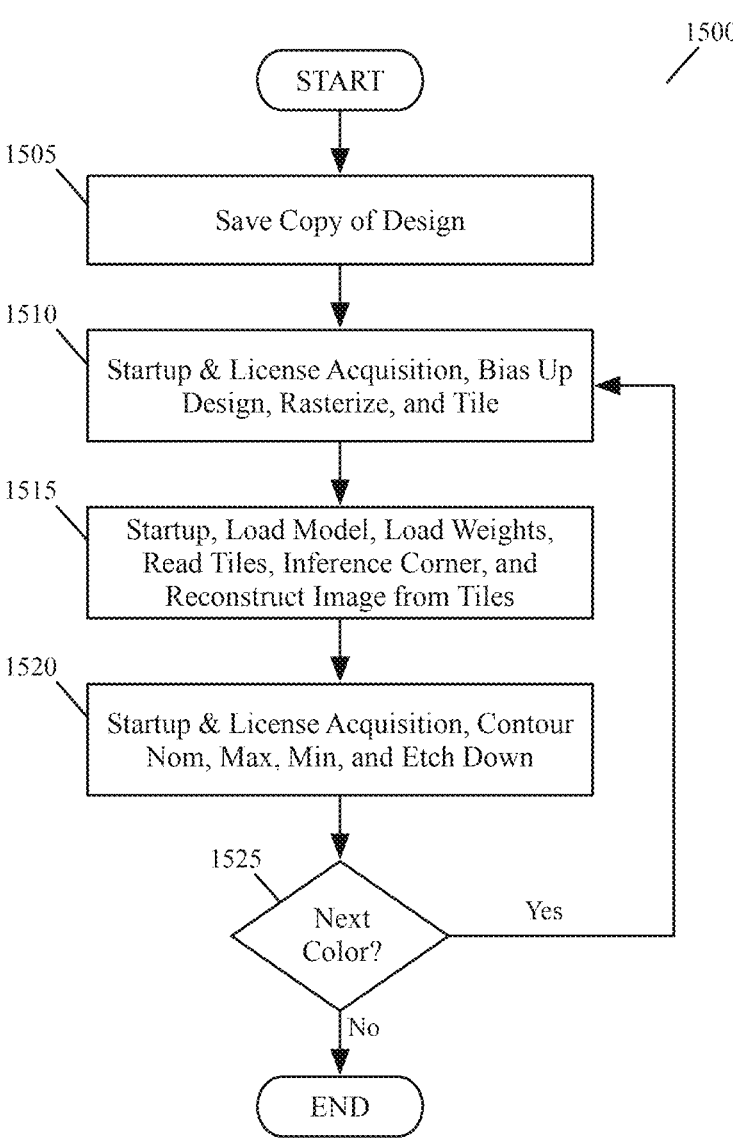
FIG. 15 illustrates a process for producing the contours from which FIGS. 13-14 were derived.

FIG. 15 illustrates a process 1500 for producing the contours from which FIGS. 13-14 were derived. As shown, the layout editing software initially saves (at 1505) a copy of the design. Next, at 1510, the manufacturing software process starts up, acquires license, biases-up the metal/contact/via layers of the design (increase in size by expanding each polygon edge by some amount) and converts the design to a rasterized format (convert from the geometry domain of the layout editing tool, to the raster domain i.e., a pixelated image form). The pixel image is then cropped into a number of smaller tiles.

At 1515, the deep learning software process starts up, in which a trained deep learning model is used to infer the shapes that appear on a wafer after manufacturing. The process loads its neural network along with its weights and produces a matching set of tiles corresponding to the input design. These tiles are then reconstructed to form a pixel image of the manufactured design shapes.

At 1520, the manufacturing software process (1) starts up again, (2) contours the reconstructed pixel image to determine the precise curvy manufactured shape contours, and then (3) etches down the predicted contoured design so that they are displayed and operated upon in the geometry domain utilized by the layout editing software. The deep-learning inference process is effectively repeated for multiple sets of process conditions, so that the minimum (inner), nominal, and maximum (outer) corner images are obtained. At 1525, the manufacturing software process determines whether it has processed the design components for all of the colors. If so, the process 1500 ends. Otherwise, the process 1500 returns to 1510 to repeat its operation for another set of components of another color.

The process of FIG. 15 is simplified to facilitate description and understanding of the process from a high level view. As shown, its performance in terms of elapsed time is relatively poor. More complex alternatives, involving manufacturing software processes and deep learning software processes running in parallel on multiple servers, can significantly increase the throughput. Such alternatives are described in detail in U.S. Provisional Patent Application 63/283,520 and in concurrently filed U.S. patent application Ser. No. 17/992,874, now issued as U.S. Pat. No. 12,547, 803, entitled "Leveraging Concurrency to Improve Interactivity with an EDA Tool." This provisional application 63/283,520 and concurrently filed Non-Provisional Patent Application Ser. No. 17/992,874, now issued as U.S. Pat. No. 12,547,803, are incorporated herein by reference.

Figures 16, 17:
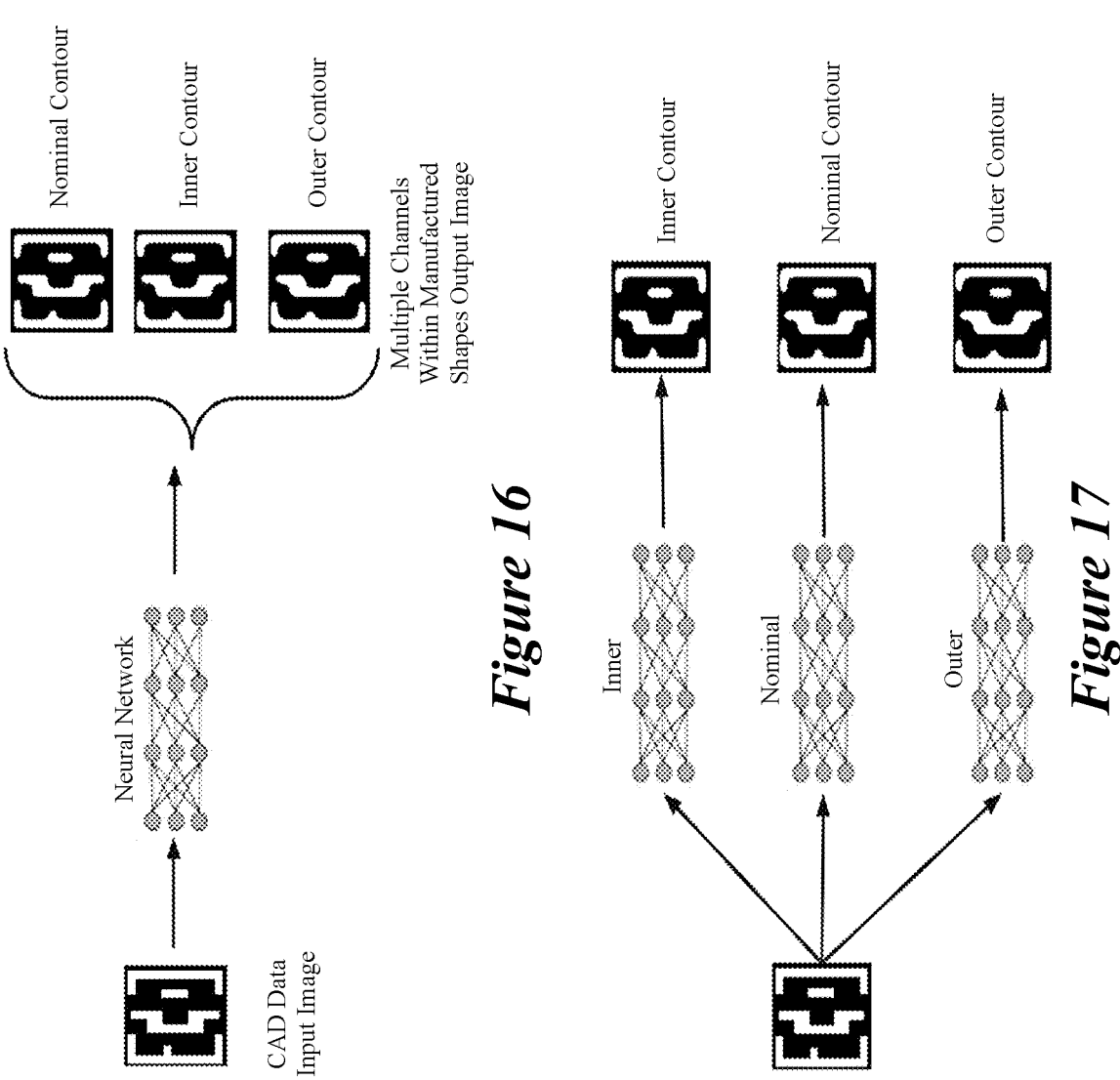
FIG. 16 illustrates the use of a neural network to infer manufactured shape tiles from rasterized CAD data input tiles that shows the operation of the neural network portion of the process in some embodiments.
FIG. 17 illustrates the use of multiple neural networks to infer manufactured shape tiles in other embodiments.

FIG. 16 illustrates an example of the use of a neural network to infer manufactured shape tiles from rasterized CAD data input tiles. This example shows the operation of the neural network portion of the process 1500 in some embodiments. Here, a single neural network is used to infer multiple output tiles at once, corresponding to different sets of process conditions. For example, the output tiles in some embodiments represent the wafer images at the process nominal condition, in addition to those at the process extremes.

FIG. 17 illustrates the use of multiple neural networks to infer manufactured shape tiles in other embodiments. Here, multiple trained neural networks are used to infer output tiles, each neural network trained to produce tiles corresponding to a different set of process conditions. For example, the output tiles from the various networks in some embodiments respectively represent the wafer images at the process nominal condition in addition to the process extremes.

Figure 18:
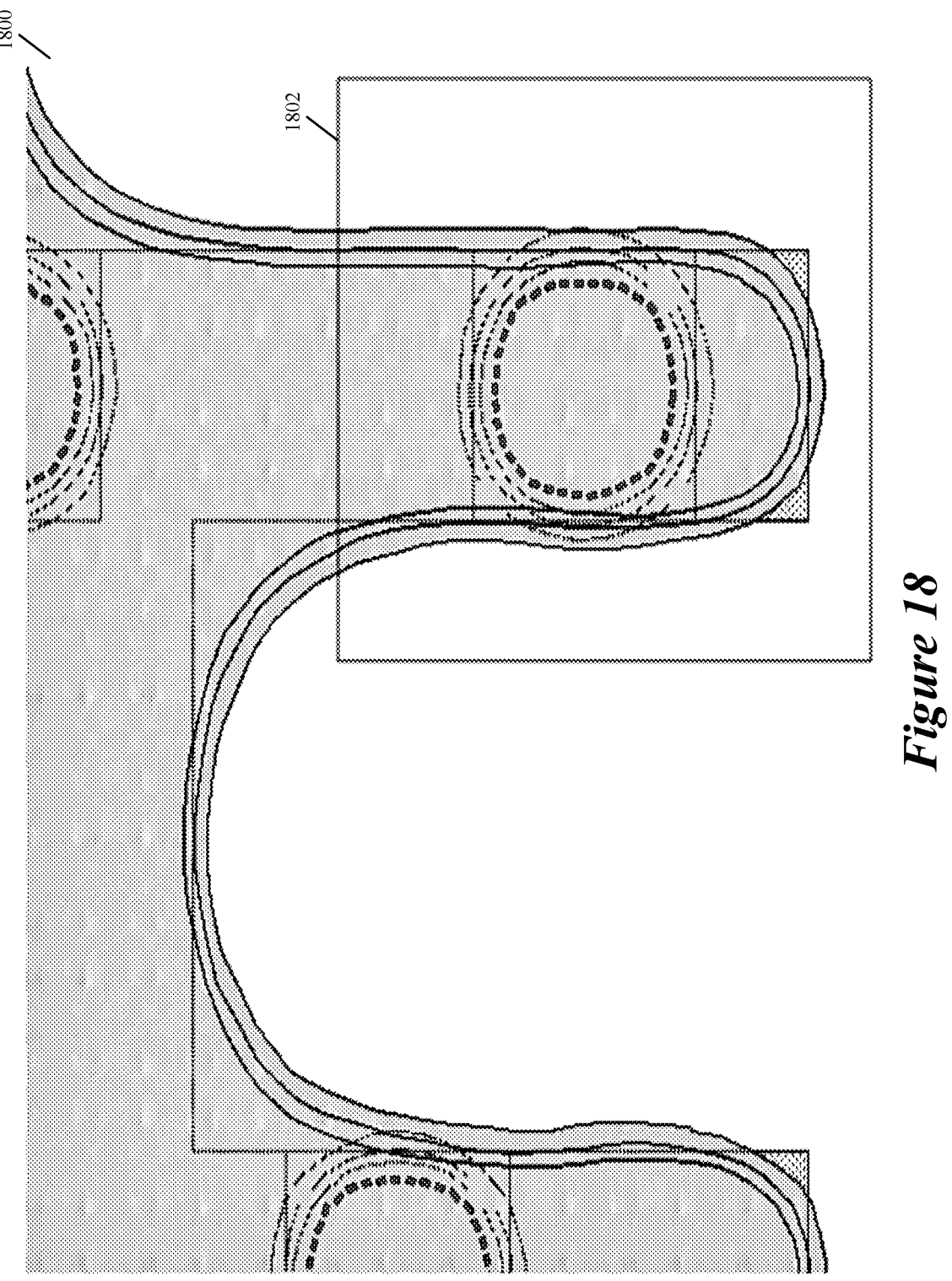
FIG. 18 illustrates an example of a further zoomed-in view of the design area highlighted in the rectangle of FIG. 14.

Returning now to the description of the manufactured contours for metal, contact and via layers, a further zoomed-in view 1800 of the design area highlighted in the rectangle 1404 of FIG. 14 is shown in FIG. 18. Here, the inner, nominal, and outer contours for the circular manufactured contact shapes, and the larger metal 'finger' shapes are clearly apparent. Also apparent is the fact that the metal/contact minimum overlap shape (displayed as a thick dashed line in a first color, e.g., in red) is even smaller in area than the inner contour (displayed as a thin dashed line in a second color, e.g., in blue) of the contact shapes themselves, as will be explained later. Looking closely at the area marked by the gray box in the figure, it seems apparent that the inner, nominal and outer contours of the metal shapes are more or less coincident with the corresponding contours of the contact shapes.

Figure 19:
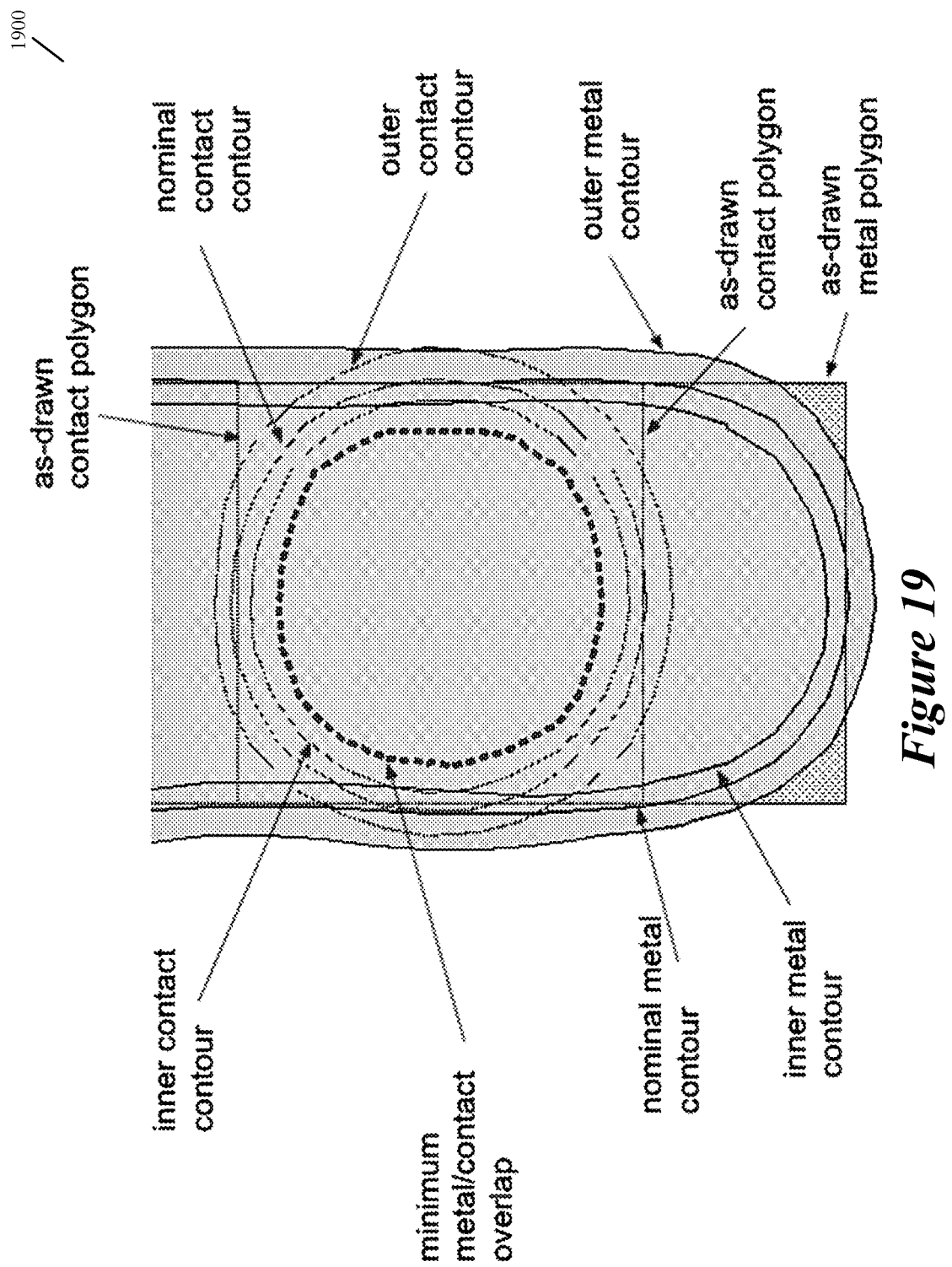
FIG. 19 illustrates an even more zoomed-in, highly detailed view of the metal/contact intersection, corresponding to the box in FIG. 18.

FIG. 19 illustrates an even more zoomed-in, highly detailed view 1900 of the metal/contact intersection, corresponding to the box 1802 in FIG. 18 that includes details of originally drawn polygons, manufactured contours, and minimum metal/contact overlap. In this figure, the inner contour for the metal 'finger' shape is more or less coincident with the (circular) inner contour for the contact shape, which would reflect reality should these semiconductor layers be perfectly aligned during manufacturing. However, due to misalignment issues inherent to practical manufacturing, this will rarely, if ever, be the case.

Without the advantages of some embodiments, it would be difficult to impossible for a circuit designer to envisage or anticipate the inner/nominal/outer contours that will result from any individual metal/contact intersection, given that the specifics of the manufactured contours will actually vary as a function of the neighboring shapes in the design. For example, metal shapes manufactured in isolation will result in different contours than those which are manufactured in close proximity to others. The same is true of contacts or vias. Given this, it is even more difficult for a designer to envisage the minimal metal/contact (or metal/via) overlap areas, and hence to correctly anticipate the resistance of that portion of the interconnect stack. Small geometry process interconnects are known to suffer from high resistance at metal/via or metal/contact interfaces, and hence it is critical that these are closely controlled.

To ensure a minimum overlap area, and a corresponding maximum overlap resistance, design rules typically exist to force designers to overlap the metal or via polygon shapes by a certain amount when drawing the metal shapes. For designers working in design-rule-exempt scenarios, however, it is desirable to know exactly what the minimum overlap shapes are so that accurate manufactured overlap areas (and corresponding resistance values) can be calculated as a function of the actual circuit layout and the circuit layout modified until these values are within tolerance.

To accurately calculate the minimum overlap for any given metal/contact or metal/via intersection (and hence the corresponding resistance value), the contours of the manufactured metal and contact/via shapes need to be known, taking neighborhood/proximity effects into account. In some embodiments, these contours are first determined by a trained neural network such as the network detailed in U.S. Patent Publication 2022/0128899. A brief overview of the process by which this is achieved is presented with respect to FIGS. 15-17. In some embodiments, the minimum overlap can then be calculated using the known contours.

Figure 20:
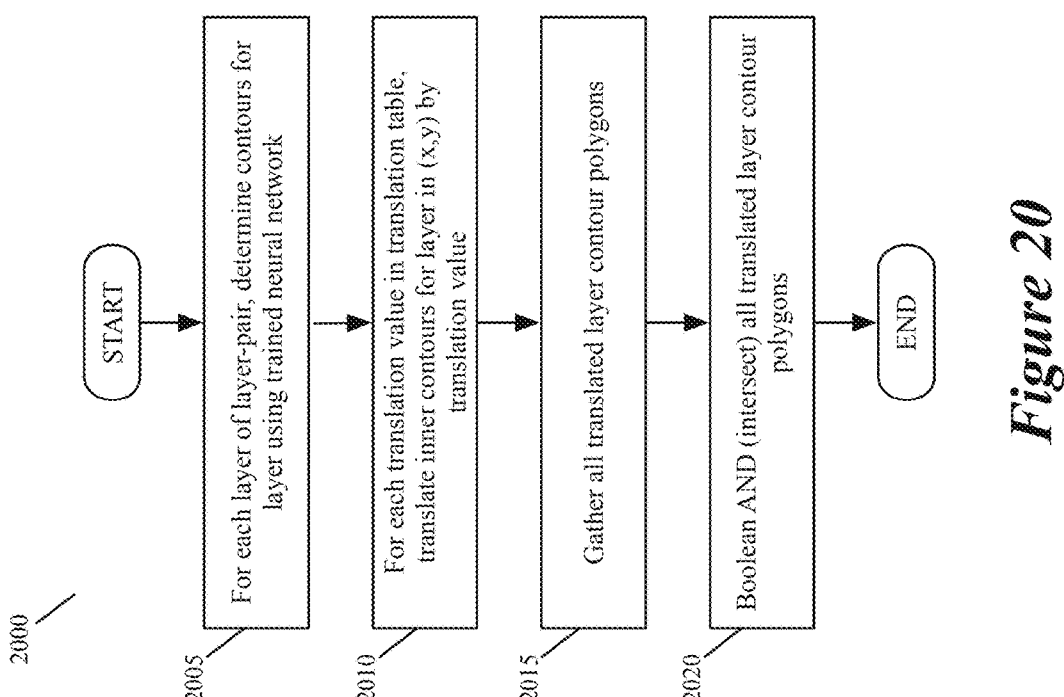
FIG. 20 illustrates a process that is used in some embodiments to compute the minimum overlap shape of a multi-layer interface that has components on multiple layers.

While possible to compute the overlap shapes using all available contours, some embodiments more efficiently perform the overlap calculations using the inner contours only (e.g., for a maximum process variation), and ignore the process condition corresponding to the outer or nominal contours. FIG. 20 illustrates a process 2000 that is used in some embodiments to compute the minimum overlap shape of a multi-layer interface that has components on multiple layers. The process 2000 starts by determining (at 2005) contours for each layer of a layer-pair by using a trained neural network. For each translation value in a translation table, the inner contours are translated (at 2010) for layer in (x,y) by a translation value. The process gathers (at 2015) all translated layer contour polygons, and intersects (at 2020) via a Boolean AND operation all translated layer contour polygons to obtain minimum overlap shape of a multi-layer interface that has components on multiple layers. After 2020, the process ends.

Figure 21:
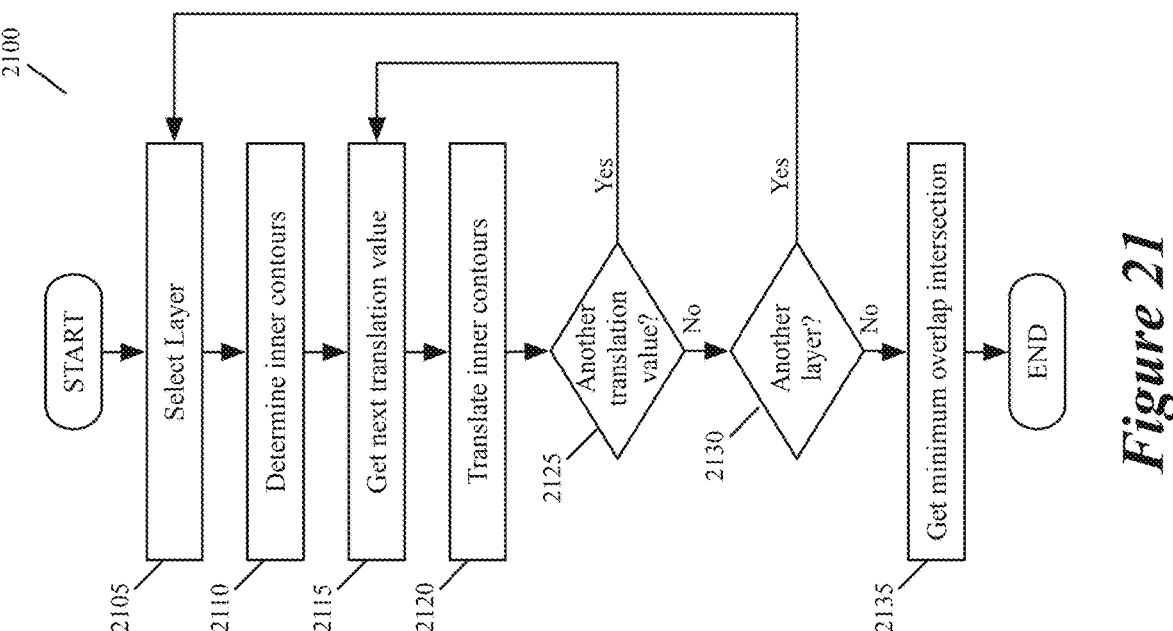
FIG. 21 illustrates a process that provides one manner for implementing the process of FIG. 20.

FIG. 21 illustrates a process 2100 that provides one manner for implementing the process 2000 of FIG. 20. As shown, the process selects (at 2105) a layer traversed by a multi-layer interface (e.g. metal-contact, or metal-via) that has components on multiple layers. The process then determines (at 2110) the inner contours for the various semiconductor shapes. At 2115, the process applies a series of mathematical translation transformations, one for each translation value in a table of translation values.

In a translation transformation, all the points in the object are moved in a straight line in the same direction. The size, the shape and the orientation of the image are the same as that of the original object. Same orientation means that the object and image are facing the same direction. With each such translation value, the process translates (at 2120) the inner contours, or 'slides' in a particular direction by a particular amount, and all such translated contours are gathered.

Next, at 2125, the process determines if all the translation values have been exhausted for a particular layer. If so, the process determines (at 2130) if another layer in the pair is to be consulted, and the process is repeated. The translation operations therefore model the results of the various possible misalignments in the manufacturing process. After the final layer has been exhausted, all translated shape contours are gathered and the process intersects (at 2135) via a Boolean operation to compute the minimum overlap area, taking all misalignments into account. After 2135, the process ends.

While some of the above-described embodiments compute the shape of the overlap area by using the inner contour, other embodiments use the nominal and/or outer contours, as mentioned above. Other embodiments generate multiple overlap shapes by intersecting multiple sets of contours (e.g., one shape by intersecting the inner contour, another shape by intersecting the nominal contour and yet another shape by intersecting the outer contour). For each of these shapes, these embodiments perform a similar process to the process 2100 of FIG. 21.

Figure 22:
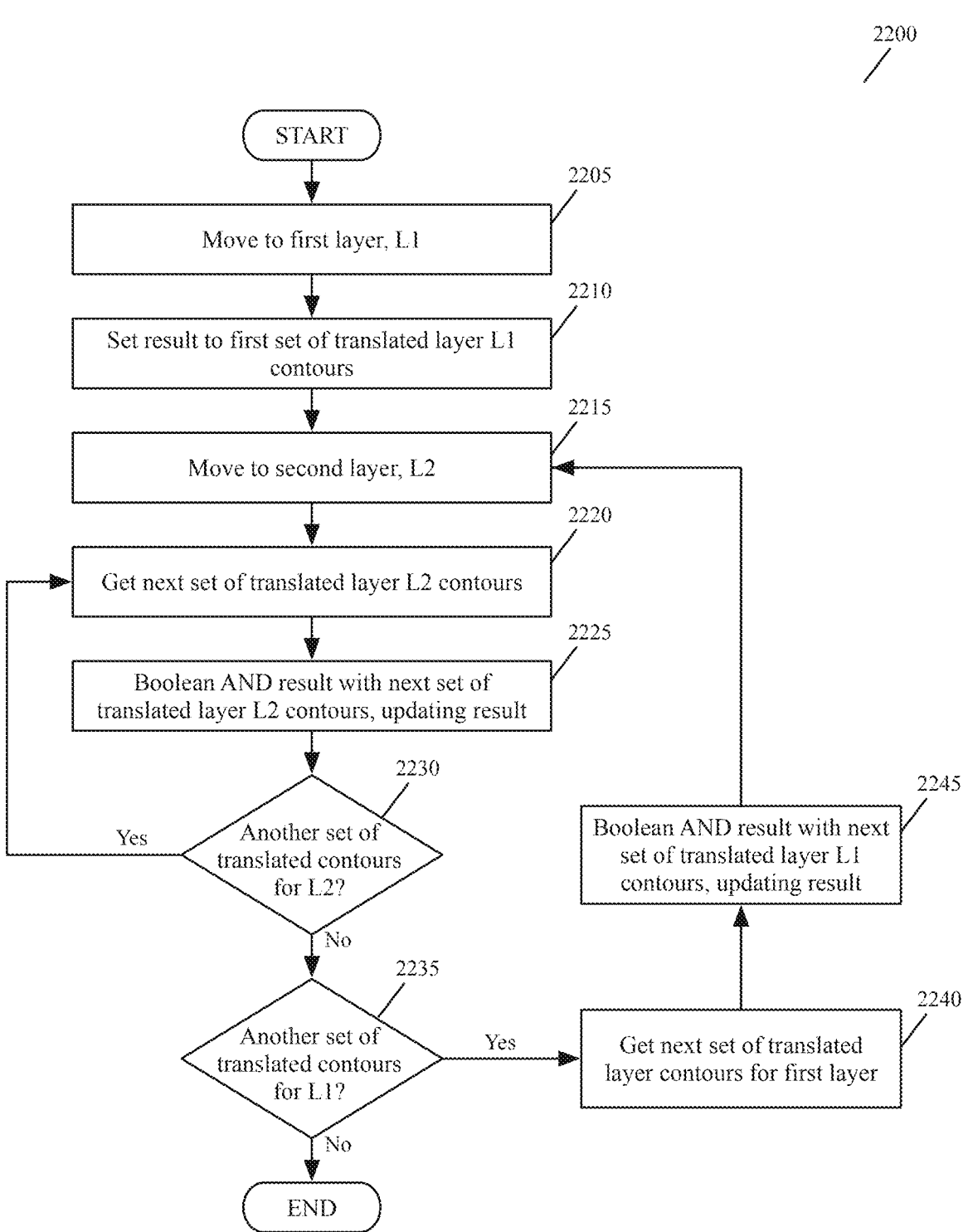
FIG. 22 illustrates a process that describes one of the steps in FIG. 21.

FIG. 22 illustrates a process 2200 that describes step 2135 of the process 2100. As shown, the process moves (at 2205) to a first layer (L1) and sets (at 2210) the first set of translated contours for the first layer as the initial result. The process then moves (at 2215) to a second layer (L2) and retrieves (at 2220) a next set of translated contours for the second layer L2. The initial result from 2210 is then subject to a Boolean AND operation (at 2225) with each set of translated contours for the second layer.

This process repeats until it determines (at 2230) that there are no more translated contours for the second layer. The process then determines (at 2235) if there is another set of translated contours for the first layer. If so, the process moves back and retrieves (at 2240) the next translation for the first layer, and performs (at 2245) a Boolean AND operation of the result with each set of translated contours for the first layer and continues the operation. Otherwise, the process 2200 ends.

In this way, all combinations of translated inner contours for the first and second layers are visited, and used to Boolean AND (intersected with) each other to produce the final result. At the end of the process, each of the original polygon shapes from the initial set of 'inner' contours has been reduced to a minimum shape representing the intersection of all the shapes (on a per-shape basis), such as those depicted with the thick dashed lines (displayed in a first color, e.g., in red) in FIG. 19.

During the process of FIG. 21, each manufactured layer shape's inner contour is computed, and 'misaligned' within the known misalignment limits known for the manufacturing process for that layer. A representative number of such possible misalignments are computed, as listed in a misalignment table 2300 in FIG. 23 further described below, and so the layer contours are translated in the (x,y) directions by the corresponding misalignment amounts. It is assumed that all manufactured shapes on any given layer are misaligned in the same way due to print bias in the manufacturing process. The misalignments can therefore be applied to all the inner contour shapes of a given layer via the same affine transformation involving a translation in the X and/or Y directions.

In some embodiments, the misalignment translations applied to each layer are listed in the table 2300 of FIG. 23. Here, the maximum misalignment is assumed to be up to 2 nm in either the X or Y directions, and the four rows in the table correspond to misaligning the layer in direction of each of the 4 cardinal compass directions (N, E, S, W) by the maximum misalignment amount (2 nm). Though the translations could be applied in any arbitrary order, it is best to perform or gather them in a clockwise or anticlockwise manner, for example within the order shown in the table. The reason for this will be made apparent further below, when the results of such operations are presented to a user via a series of animations. Having a smooth order that traverses in a circular manner, rather than an arbitrary or 'jerky' manner, will improve the user experience and reduce cognitive burden when viewing the animations.

In other embodiments, the misalignment translations applied to each layer are listed in the table 2400 in FIG. 24. Here, the maximum alignment is assumed to be up to 2 nm in either the X or Y directions, and the four rows in the table correspond to misaligning the layer in direction of each of the 4 ordinal compass directions (NE, SE, SW, NW) by the maximum misalignment amount (2 nm). For an even more accurate representation, additional values in some embodiments can be included in the table, where the contours are misaligned in both X and Y directions at once, rather than just in one direction at a time. Again assuming a 2 nm maximum misalignment in either X or Y direction independently, the resulting table 2500 is shown in FIG. 25, in which misalignments in the both the 4-cardinal (primary) and 4-ordinal compass directions are included.

In some embodiments, different misalignments can be explored for different pairs of interconnect layers. Also, in some embodiments, different misalignments can be explored for different x- and y-axis directions. The misalignments in some embodiments are defined with respect to a z-axis, which is the vertical axis that is along the direction on which the metal layers are stacked on top of the substrate layer and on top of each other.

Figure 26:
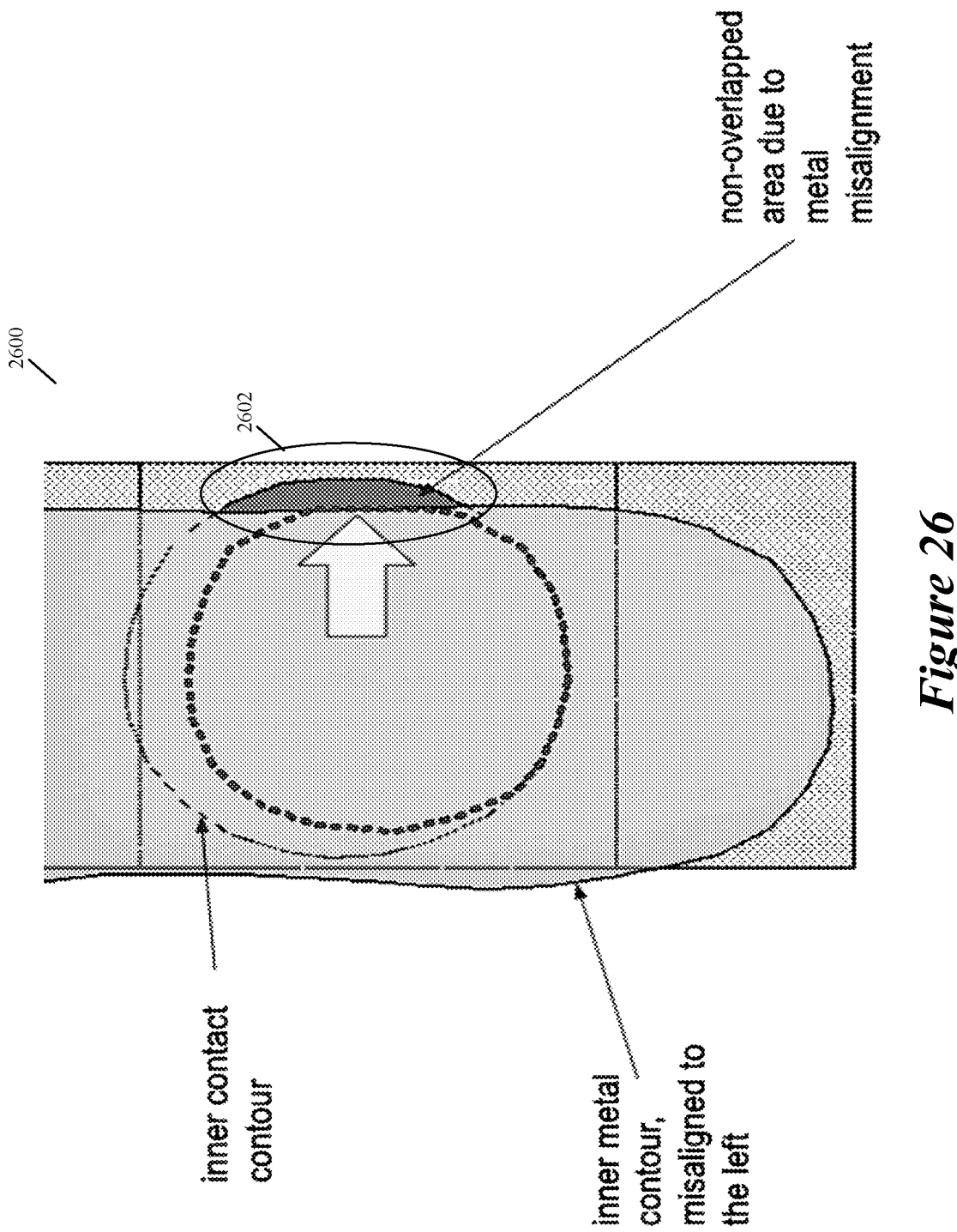
FIG. 26 illustrates an example of one misalignment configuration that shows a non-overlapped area due to misalignment.

The intersection of the misaligned polygons to compute the minimum overlap are computed by Boolean AND operations in some embodiments, using any of a variety of algorithms. Some standard algorithms that can be used for computing the resulting clipped polygon, given the translated inner contour polygons, include the Greiner-Hormann clipping algorithm and the Sutherland-Hodgman clipping algorithm. These algorithms are applied in sequence on a per-layer basis. When only two layers are involved, just a single layer intersection is performed, but where multiple layers are involved (e.g. M1-vial-M2), then the intersection operation is performed at each layer interface (e.g. M10- vial) and (vial-M2). FIG. 26 illustrates a graphical example of such a Boolean Layer AND operation.

FIG. 26 illustrates an example 2600 of one misalignment configuration that shows a non-overlapped area due to misalignment. Here, the inner metal contour is shown translated to the left by the maximum misalignment amount. The inner contact layer contour is shown translated by a different amount (one of the possible combinations). By ANDing the translated two layers together (an intersection operation), the circled area 2602 of non-overlap is effectively removed, thus 'clipping' the minimum overlap shape on the right edge, as indicated by the large white arrow. Other edges will also be 'clipped' by this operation, which is not shown in the figure for simplification.

Minimum overlap polygons are produced for each layer interface, and all overlap polygons for a particular layer interface are assigned to a dedicated Layer Purpose Pair (LPP) within a layout editor, such as Synopsys' Custom Compiler or Cadence's Virtuoso, with which to display the results. An LPP can be considered a physical or other design entity used as a visual representation of different types of information, such as mask geometries and interconnection in schematics. Each unique layer purpose pair has its own associated colors, highlighting, menus, and design objects. Visual examples of different LPPs in use have been shown in FIG. 9, in which different colors and stipple patterns associated with those LPPs were employed to show the various design layers such as polysilicon, metal 1, contact, etc.

By dynamically creating minimum overlap polygons on dedicated LPPs within the layout editor for a given design, and storing these polygons within or alongside the regular polygons representing the design database itself, it is possible for the layout editor tool to render the minimum overlap polygons along with those of the design cell itself (those drawn by the designer), and have the overlap polygons dynamically re-drawn at the correct zoom level by the layout editor software as the user interacts with the design via zoom and pan operations in the user interface. Examples of the results of these dynamic redraw operations have been shown in FIGS. 11-14, 19 and 20. For each zoom/pan viewport presented in the figures, the minimum overlap polygons are drawn at the same resolution and at the same time as the other design figures.

In some embodiments, the minimum overlap polygons are drawn using an LPP which is drawn above/after the regular design polygons and the contours for the metal and via/contact layers. A stipple pattern in some embodiments is used which effectively makes the minimum overlap polygon translucent, even when drawn with an opacity value of 100%. In other embodiments, the contours and/or minimum overlap polygons are drawn using an opacity value of less than 100%, making them appear translucent regardless of stipple pattern.

Figure 27:
FIG. 27 illustrates an example of a dynamic ruler measurement of the selected minimum overlap area polygon width.
Figure 27:
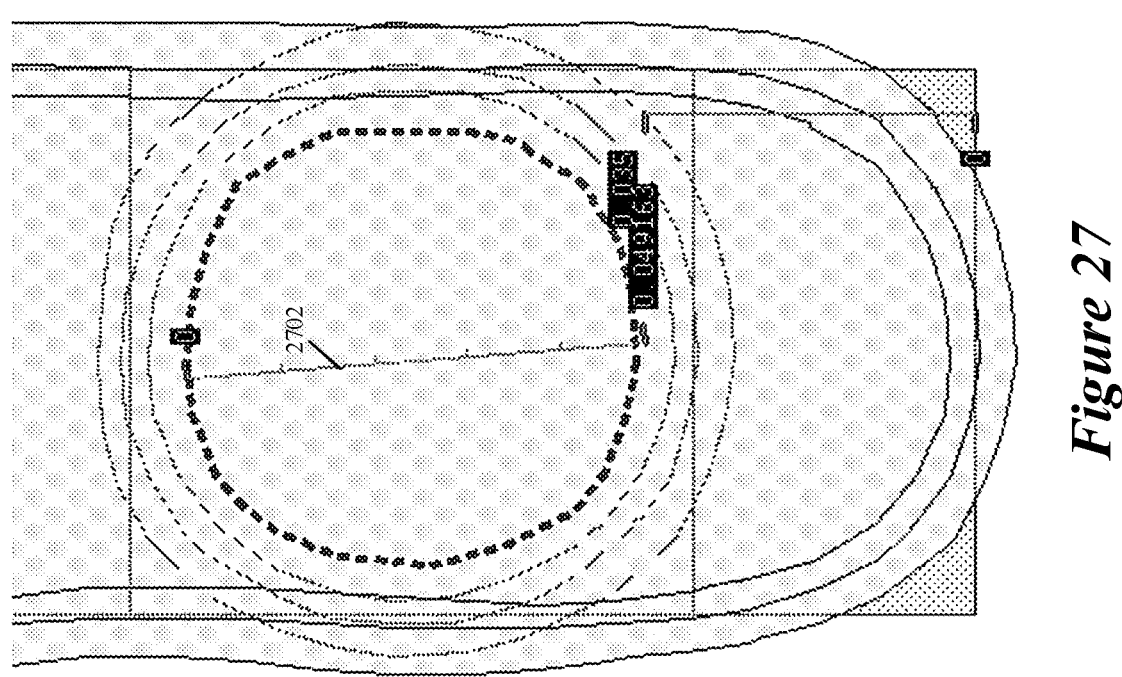

Various interactive user operations are possible on the minimum overlap contours displayed within the layout editor in some embodiments. For example, it is possible to select the overlap shape, and query its properties, such as the bounding box, locations of the individual polygon vertices, etc. FIG. 27 illustrates an example of a dynamic ruler measurement 2702 of the selected minimum overlap area polygon width. Measurements such as inserting dynamic rulers measure the distance between points or edges on the minimum overlap contour and the neighboring shapes in the design.

Figure 28:
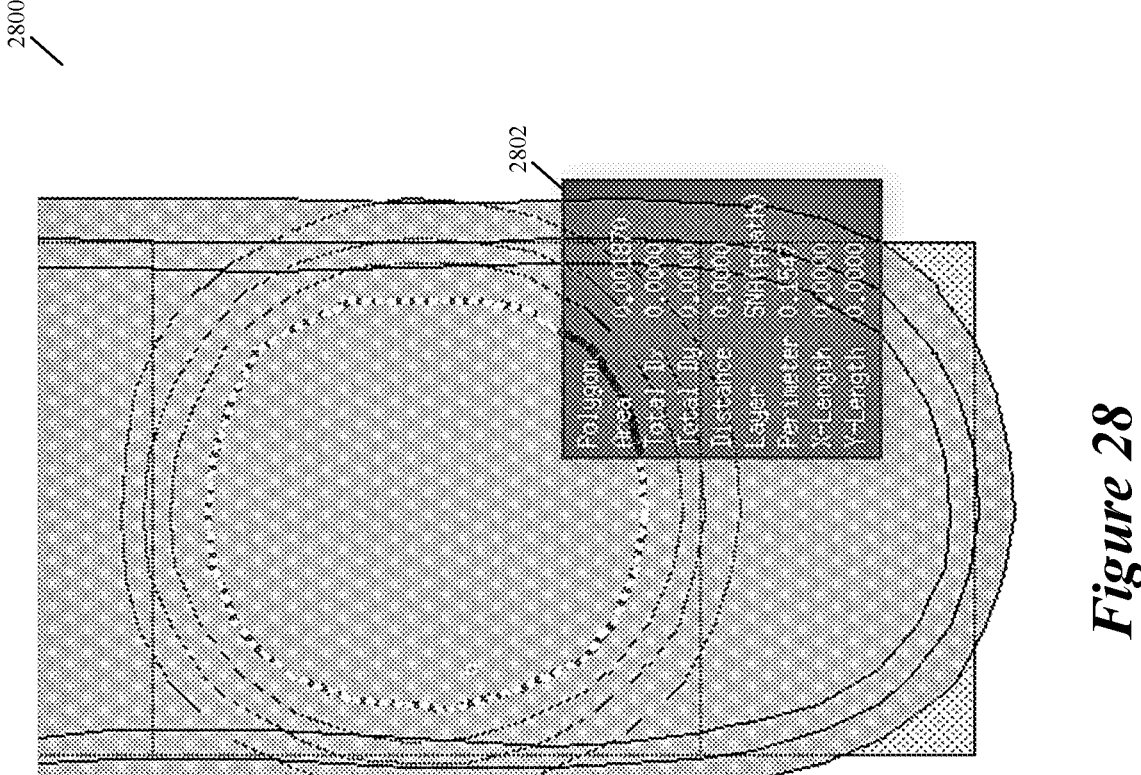
FIG. 28 illustrates an example of a dynamic display of minimum overlay area polygon properties, including area.

FIG. 28 illustrates an example of a dynamic display of minimum overlay area polygon properties, including area.

By dynamically hovering the mouse near the overlap shape, the shape can be highlighted (for example in a bright yellow color) and have a translucent (or opaque) information balloon 2802 dynamically appear after a short delay, in which properties of the contour shape (such as its constituent points, overall bounding box, etc.) are displayed. In some embodiments, the (maximum) resistance of the minimum overlay polygon is further calculated and displayed in either the property editor, the dynamic information balloon, or both, based on the area of the polygon, and other information in the technology file (such as the material from which the contact/via is made, its height, resistivity, etc.). The information presented allows the designer to modify the layout (e.g., so as to result in an increased minimum overlap area, with decreased maximum resistance), and repeat the analysis process to verify.

Figure 29:
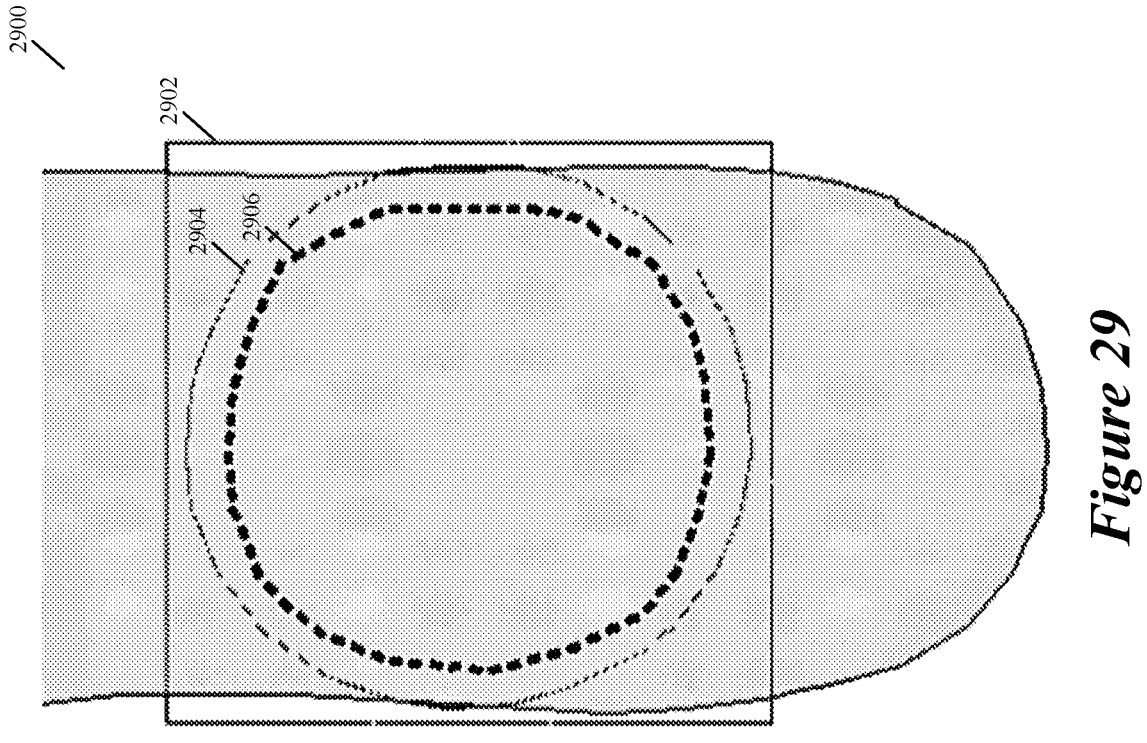
FIG. 29 illustrates an example of an originally drawn contact polygon, inner contours only of manufactured contact and metal, and minimum metal/contact overlap.

In some embodiments, the inner contours only of the various layers involved in the overlay are shown. FIG. 29 illustrates an example of an originally drawn contact polygon 2902, inner contours only of manufactured contact and metal 2904, and minimum metal/contact overlap 2906. In this figure, the originally drawn metal shape is not shown, nor are the nominal or outer contours for either the contact or metal manufactured shapes.

While it is most important to consider the minimal overlap case (as this leads to the maximum resistance, which is critical to circuit performance), it is also important for designers to know the range of possible overlap values for each contour region. This can be used to determine a resistance range (minimum resistance value, nominal resistance value, and maximum resistance value) for any given contact or via. The technique for determining the minimal overlap in the presence of manufacturing variations, neighborhood effects and manufacturing layer misalignments can also be used to compute the nominal overlap. In this situation, instead of using the minimum contours in the process of FIG. 20, the nominal contours are used in their place. The resulting area and contact/via resistance calculations will then represent the 'typical' or nominal case from a process variation standpoint, in the presence of the same manufacturing misalignments. Likewise, the outer contours can be substituted in order for the maximum overlap area (and its associated resistance) to be computed, thus establishing the minimum resistance for each contact/via instance in the presence of the manufacturing process variations and layer misalignment.

Figure 30:
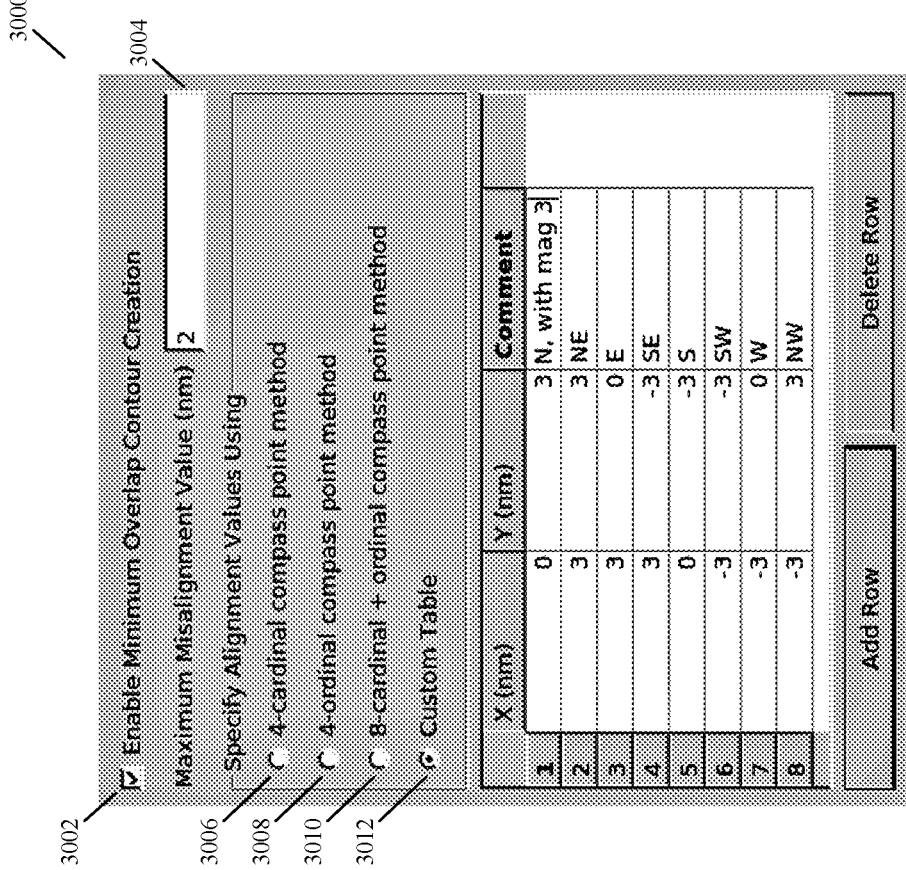
FIG. 30 illustrates an example of a graphical user interface for configuring minimum overlap computations provided to assist the user with the task of setting up the operations to be performed in some embodiments.

FIG. 30 illustrates an example of a graphical user interface 3000 for configuring minimum overlap computations provided to assist the user with the task of setting up the operations to be performed in some embodiments. The user interface 3000 includes a checkbox 3002 which enables/disables the entire process of creating the minimum shape overlap after the contours have been determined (e.g., by use of a separate GUI control such as a push button for initiating and displaying such contours). The interface 3000 includes a control 3004 allowing for the maximum misalignment value to be specified, in nanometers. The user interface 3000 also includes a number of mutually exclusive controls 3006-3012 dictating how the misalignment translation transformations are to be performed, effectively allowing the user to choose between one of: (1) the predefined cardinal compass point tables of FIG. 23, (2) the pre-defined ordinal compass point tables of FIG. 24, (3) the 8 pre-defined cardinal+ordinal compass point table of FIG. 25 or (4) an arbitrary number of translations in arbitrary directions, with arbitrary magnitudes, via the entering of a custom value table.

The custom value table allows the user to enter their own values, adding new rows or deleting existing rows as appropriate, and setting the values of the alignment X and Y parameters differently for each row. In some embodiments, different magnitudes for the misalignment translation vector are also entered here (for example, in the figure the user is shown entering values corresponding to a maximum misalignment value of 3 nm in any of the 8 compass directions). Directions different to the cardinal and ordinal compass points are also entered in some embodiments, and the number of rows include any positive integer. Standard table editing interfaces familiar to those skilled in the art of GUI design are also used here.

While the display of (and interaction with) the minimal overlap area polygons is useful for a circuit designer to understand the sources of contact/via resistances, it would be even more useful to further aid the designer in intuitively understanding exactly how those overlap shapes are arrived at. Such understanding can aid the designer in modifying the design layout in order to attain desired overlap shapes (and commensurate resistance values). This is particularly the case for those designers working in design-rule-exempt scenarios, who will have more freedom to modify the design layout in order to achieve minimal resistances, and hence maximum device performance, but it also applies to designers working with standard DRC enforced flows.

By having a better understanding of why the minimal overlap shapes are exactly what they are, the designer can do a better (or quicker) job of modifying the design layout. In particular, if the designer can understand exactly how each edge of the minimum overlap area polygon has been determined for a particular contact or via of interest, they can be in the best position of modifying the layout to cause that edge to move further out, thus increasing the minimum overlap area.

Some embodiments use a few different methods to present the user with this understanding, including creation of a looping video-like animation and dynamic, interactive animation. With a looping video-like animation approach, a sequence of static images are generated showing the manufactured design shapes smoothly 'moving' throughout the range of motion selected to represent the misalignments.

Figure 31:
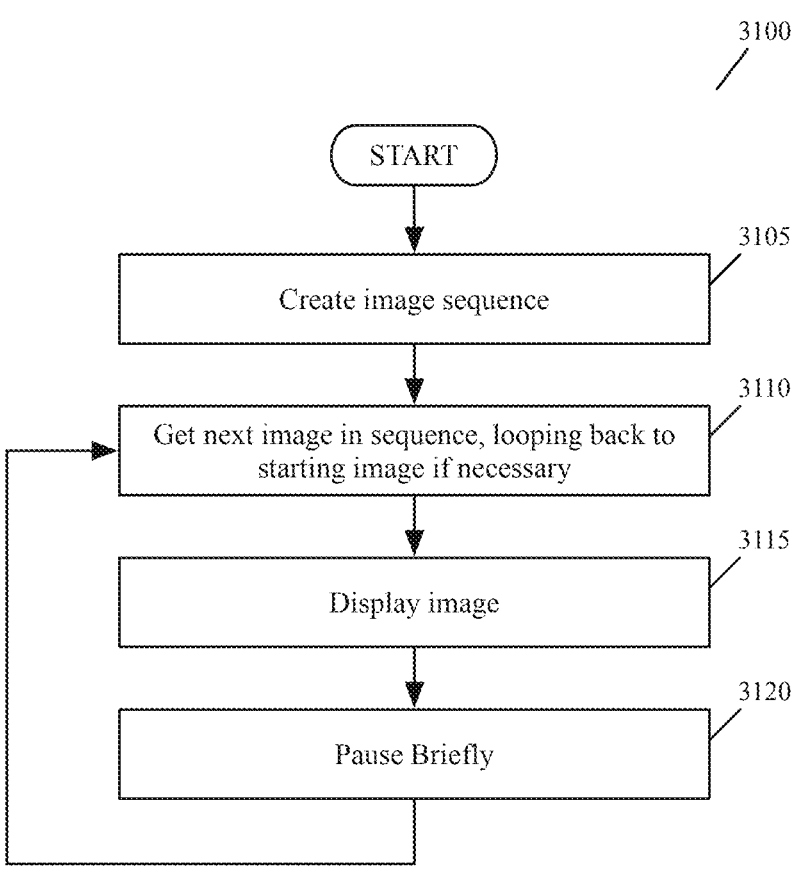
FIG. 31 illustrates a process for a looping video-like animation using static images.

FIG. 31 illustrates an animation process 3100 for a looping video-like animation using static images. First, the process creates (at 3105) a sequence of images or screenshots, in each of which the design shapes are 'jiggled' out of position, i.e., intentionally misaligned by one of the translations in the translation table. As the video is played in a loop, the playback process advances (at 3110) to the next image in the sequence, renders (at 3115) that image, and then briefly pauses (at 3120), allowing the user to absorb what happened. After the pause, the process continues with the next image in the sequence. When the list of images is exhausted, the process 'loops' back to the starting image. As stated previously in the discussion with respect to the generation of the misalignment translation transforms, when presenting these images, it is best to do so in a manner where the misalignments are applied in a 'circular' manner, rather than some arbitrary or 'jerky' manner. This reduces cognitive burden on the user when viewing the animations, and facilitates learning. A sequence of overlapping images (such as the overlapping shapes of FIGS. 26 and 27 or the overlapping images produced by overlapping the contours shown in FIGS. 18 and 19) are presented to the user, with certain 'frames' in the sequence showing the cropping of a portion of the effective via or contact shape, down to its minimum value.

In some embodiments, the translations are augmented by adding additional translations to the sequence, which effectively 'revert' the layer shapes to their non-misaligned (i.e., perfectly centered) positions. Frames created this way are rendered in between the misaligned frames, thus the user experiences the shapes moving as if subject to a misalignment, then experiences the shapes all perfectly aligned ('reverting' the misalignment), then misaligned again to a different misalignment position, etc. The interposition of the non-misaligned (centered) frames in this way further helps the user to form a better mental image of the animation sequence, as the animation reversions provide a static point of reference in between each animation frame, thus providing better visual continuity and reducing confusion.

In some embodiments, standard video playback controls are provided which allow the user to simply play the animation sequence in a loop, pause (interrupt), or resume the video. In some embodiments, the user can additionally control the playback speed, and/or playback direction (i.e., the user can reverse the order in which the animations are shown). This can allow the user to more easily focus on certain cropping events, determine which contour edges are responsible for the cropping, and so determine which edges to move by editing the corresponding layout shape(s), perhaps modifying shape size, position, or both.

Figure 32:
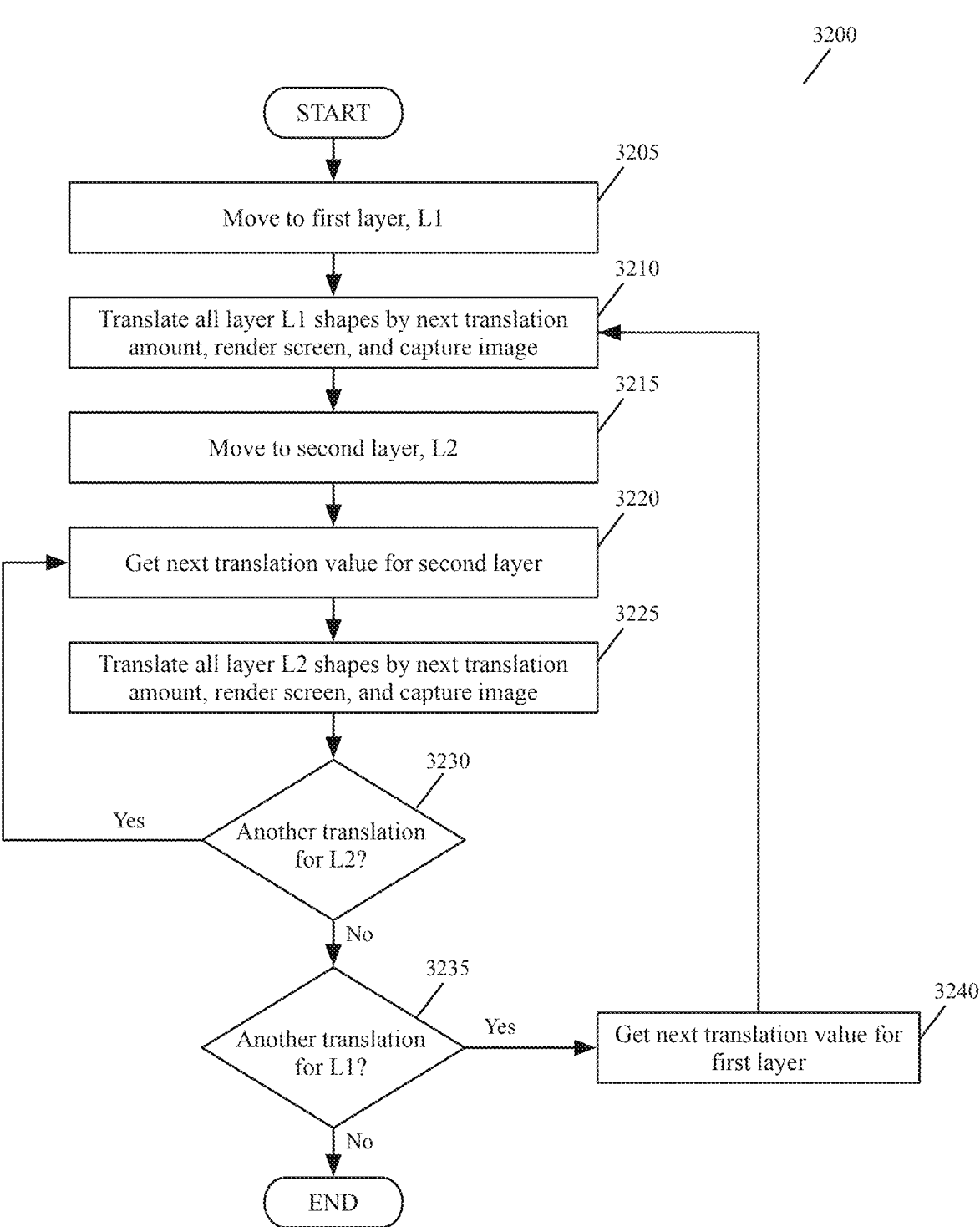
FIG. 32 illustrates a process by which an image sequence is generated.

FIG. 32 illustrates a process 3200 by which an image sequence is generated. As shown, the process moves (at 3205) to a first layer (L1) and translates (at 3210) all layer L1 shapes by the next translation amount, renders the screen, and captures an image. The process then moves (at 3215) to a second layer (L2) and retrieves (at 3220) a next translation value for the second layer. The process then translates (at 3225) all layer L2 shapes by the next translation amount, renders the screen and captures an image. The process repeats until it determines (at 3230) that there are no more translation values for the second layer. The process then determines (at 3235) if there is another translation value for the first layer. If so, the process moves back and retrieves (at 3240) the next translation value for the first layer. The process repeats until it determines (at 3235) that there are no more translation values for the first layer. After 3235, the process ends.

This process has outer and inner loops that ensure all combinations of translation events are iterated over, translating (sliding) the contour shapes for each translation amount, rendering the layout, and then capturing a screenshot after each translation event. Each captured screenshot is added to the sequence. The process begins with the first translation value for the first layer, and then proceeds through each of the translation values for the second layer. It then reverts to the first layer, and translates it by the second translation specified in the table, before again proceeding through each of the translations for the second layer, thus enumerating all combinations.

One advantage of the animation method using static screenshots is that it is automatically rendered and saved as a 'movie' to a common video file format, and therefore visualized outside of the layout editing tool itself. For example, a video capture of the animation in some embodiments is saved in an animated GIF image (.gif file), or in a movie format such as a .mov or .mp3 file, and then embedded in a presentation etc.

However, this approach does not make it possible to dynamically pan and zoom practically around the movie images and see the shapes at a higher resolution, as would normally be performed by a layout engineer within an interactive layout editor. It would be desirable for the layout editor user to be able to zoom and pan to any area of the layout of interest, and have the shapes dynamically redrawn, following the animation sequence. For example, the user may wish to zoom in, zoom in again, and zoom in a third time, before panning left twice, in order to view a particular contact or via interface along with just its immediate neighboring metal shapes, in high detail. It would also be beneficial if the user can perform edits on the design between different renderings of an animation.

Therefore, in some embodiments, an interactive, dynamic approach is used to animate the sequence of events. Here, the layout editor uses an animation process (of its own or a separate program) to retrieve the contours which are to be animated, and an event is scheduled in the near future (e.g. ⅓ of a second) to render those contours using the next translation in the sequence of augmented translations. Prior to that scheduled event occurring, in some embodiments, the user continues to use the layout editor in their regular manner, e.g., zooming and panning around the design.

Once the time comes to process the event, the layout editor displays the next rendering in the animation, which is generated by the animation process of the layout editor or of the other program applying the next translation vector in the augmented sequence to the shapes. Any previously drawn shapes are erased, and the newly positioned shapes (according to the current misalignment translation value) are drawn. The layout editor then 'refreshes' or redraws the graphics screen the new rendering, and another animation event is scheduled in the near future, before the editor is allowed to return to its event loop. Again, prior to that next scheduled animation event occurring, in some embodiments, the user chooses to interact with the layout tool, zooming, panning, hovering the mouse over objects of interest, selecting or highlighting objects, performing a design edit operation, etc. When the next scheduled animation event is processed, the previously drawn contour shapes are erased, repositioned and redrawn according to the next misalignment vector value in the sequence, etc.

In some embodiments, the sequence of translations are augmented with translations that 'revert' the translated shapes back to their perfectly aligned positions, thus establishing a steady frame of reference for the user viewing or interacting with the animation sequence. As for the creation of the video-like sequence of static images, these 'reversion' events are interjected between the normal animation sequence of events. Hence, in some embodiments, a first event is scheduled in which one of the layers is offset by a certain misalignment vector value.

Once processed and rendered by the layout editor, the next scheduled event will 'undo' or 'revert' that misalignment, to present the user with a static, non-moving reference. The next scheduled event after that then misaligns the layers again. In between events (regular misaligned events or the special 'revert' events), the user is still free to interact with the tool in the normal manner, performing zoom and pan operations, etc. In some embodiments, the animation shapes presented are limited to the inner contours only. This form allows the user to best understand how the 'clipping' to the final minimum overlap shape happens, without excessive visual clutter.

Figure 33:
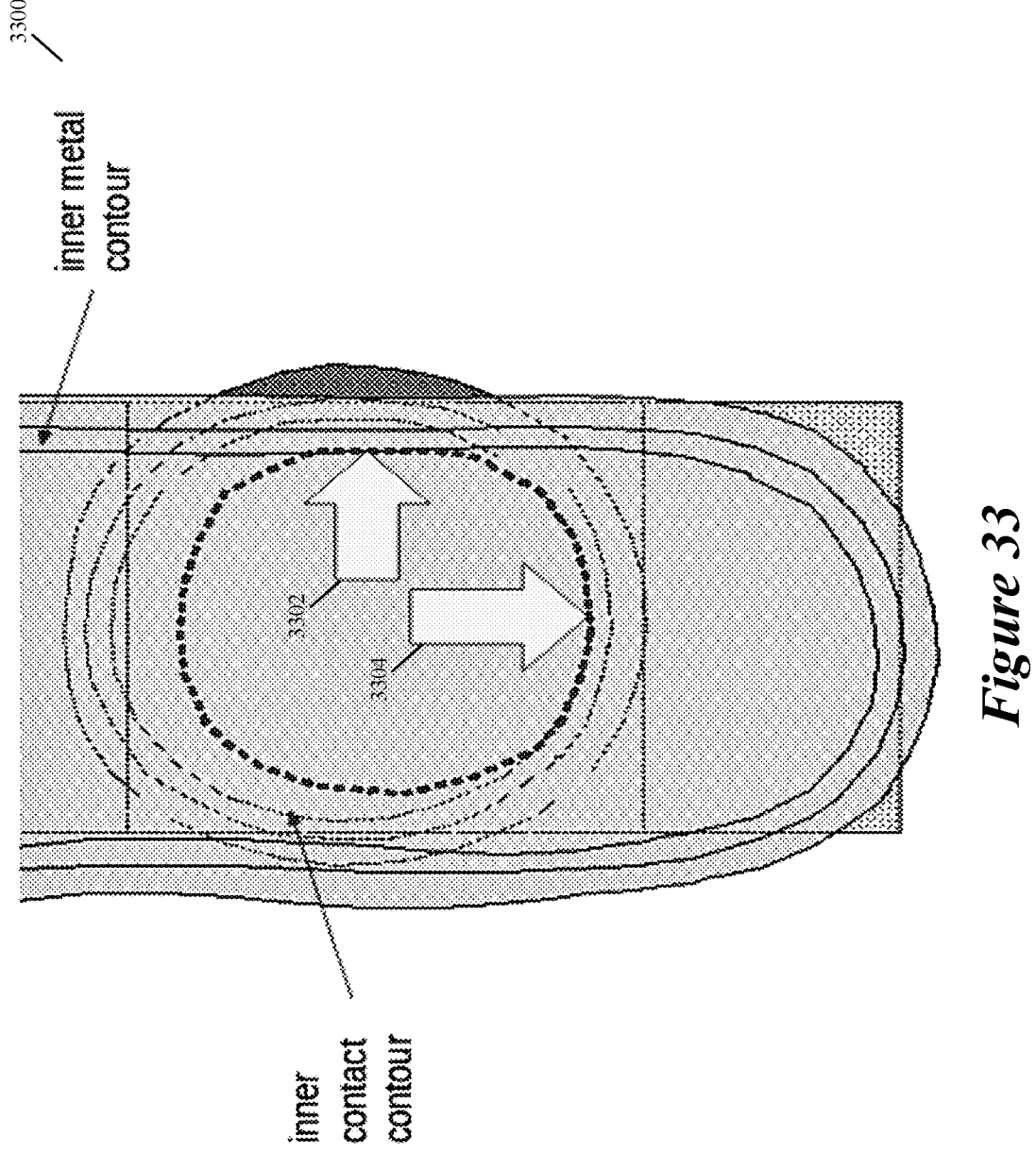
FIG. 33 illustrates an example of misaligned contours for metal and contact shapes, showing nominal, inner and outer contours and where all three sets of contours are rendered.

In some embodiments, the animation shapes presented include the inner, nominal, and outer contours all at the same time. FIG. 33 illustrates an example of misaligned contours for metal and contact shapes, showing nominal, inner, and outer contours and where all three sets of contours are rendered. The large, right pointing arrow 3302 shows a clipping event, in which the right hand side of the minimum overlap via/contact polygon is being clipped by the inner contour of the metal. A second clipping event is shown by the large downward pointing arrow 3304, in which the bottom edge of the minimum overlap polygon is effectively being clipped by the bottom of the inner contour for the via/contact shape. The inner metal and contact contours that participate in the clipping event for this particular misalignment combination are also annotated in the figure.

Not all misalignment value translations lead to clipping events, i.e., not all translations contribute to the final minimum overlap polygon shapes, and some of the relatively sparse subset of translations that do lead to clipping events are 'missed' by a user quickly perusing the sequence. In some embodiments, therefore, arrow polygons such as shown in FIG. 33 are dynamically created and added to the layout as the animation contour shapes themselves are drawn, but only when there is a clipping event, in order to direct the user's attention to clipping events.

In some embodiments, advanced interactive 'playback' controls are offered to the user, allowing the scheduled sequence of animation events to be paused, continued, or 'played' in the reverse order. First, the playback speed is affected by a user-specified 'frame delay' or frame interval. In addition, after initially viewing the entire sequence of animation events to 'establish the big picture,' in some embodiments, the method allows the user to choose via a GUI control to have the event sequence filtered to clipping events only, such that animation translation events which do not result in a clipping event are not even scheduled/shown.

Figures 34, 35:
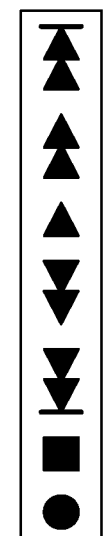
FIG. 34 illustrates a set of GUI controls that can facilitate the specification of exactly which contours to show.
FIG. 35 illustrates GUI controls such as forward, reverse buttons, and fast-forward/fast-reverse buttons to finely control the sequence of scheduled animations in this manner.

In other embodiments, the full sequence of events continues to be scheduled per the original schedule, but allows a user to choose at any time to step forward to the next event, or 'fast forward' to the next clipping event. The user is also allowed to choose whether to view the interactive animation sequence in which only some, or all of the nominal, inner, and outer contours are shown. FIG. 34 illustrates a set of GUI controls that can facilitate the specification of exactly which contours to show. FIG. 35 illustrates GUI controls such as forward, reverse buttons, and fast-forward/fast-reverse (to next/previous clipping events respectively) buttons to finely control the sequence of scheduled animations in this manner.

Figure 36:
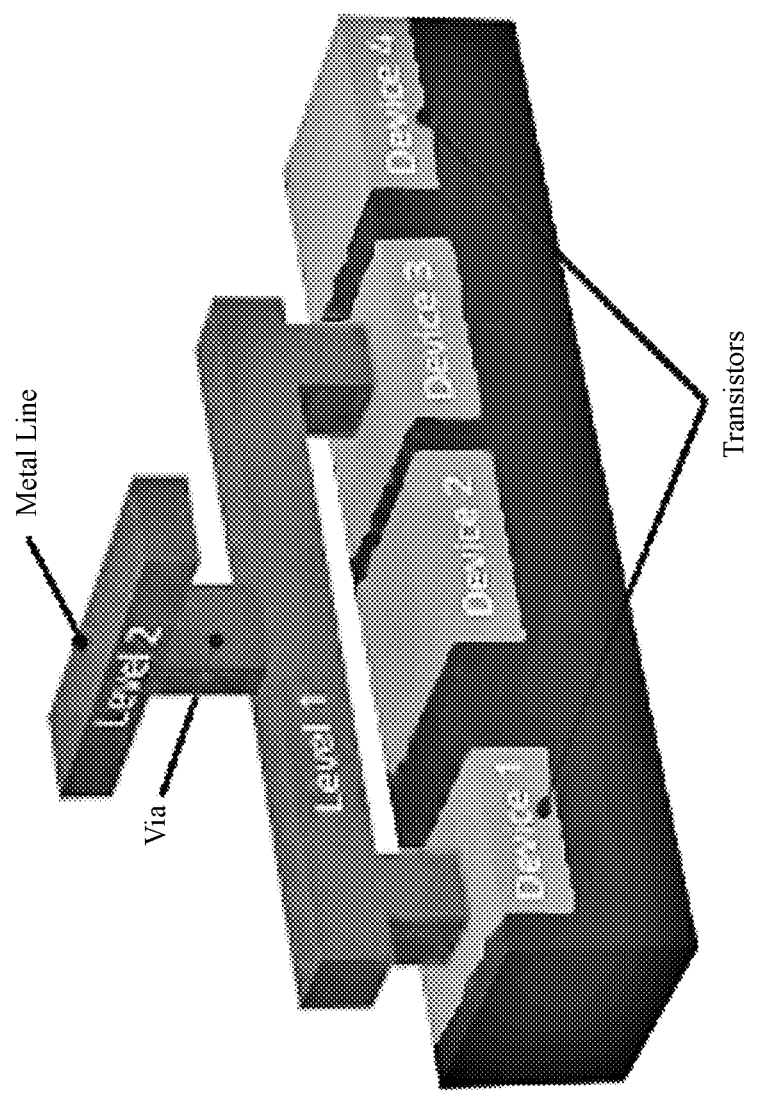
FIG. 36 illustrates an example of a routing structure for which a three dimensional via shape can be computed for the via by taking the minimum overlap polygon for the metal 1-via layer interface, along with the minimum overlap polygon for the metal 2-via layer interface, and assuming a 'roughly' cylindrical shape.

In some embodiments, a method computes (and intuitively displays) the minimum overlap area for metal and via/contact layer interfaces. With the areas computed in this manner, the corresponding maximal resistance (upper boundary) values can be determined. FIG. 36 illustrates an example of a routing structure for which a three dimensional via shape can be computed for the via by taking the minimum overlap polygon for the metal 1-via layer interface, along with the minimum overlap polygon for the metal 2-via layer interface, and assuming a "roughly" cylindrical shape. The shape is produced with a height as specified in the process technology file for the via layer, the top of which has the minimum overlap polygon for the metal 2-via interface, and the bottom of which has the minimum overlap polygon for the metal 1-via interface.

When the inner contours are used to compute the minimum overlap shapes, the 'narrowest' roughly cylindrical shape is determined, which will have the maximal via resistance. In some embodiments, it is also useful to a designer to know what the 'nominal' via resistance or the 'minimum' via resistance is. In this case, computing the overlap shapes with respect to the nominal or outer contours respectively, rather than the inner contours, is contemplated. By knowing the resistance ranges, i.e., the typical, upper and lower limits on contact or via resistances, a designer is able to make some circuit design or layout tweaks to best take those into account in eventual circuit performance.

Some flows in some embodiments include modifying the circuit layout to result in larger overlaps, optimizing a circuit layout, and changing from rectilinear design to curvilinear design. As previously discussed, modifying the circuit layout to result in larger overlaps require a change to the position or size of the metal, via and/or contact polygons. The designer is able to optimize the layout on a per individual via/contact basis, for example, to produce larger overlaps for particular via instances which are proving problematic due to excessive resistance.

In some embodiments, specific vias/instances are found that result in significantly larger overlaps than some of their neighbors. The method allows a designer to be more 'aggressive' with the layout in these areas, thus reducing the overlap area somewhat, in a tradeoff that improves some other layout metric. For example, a via or metal shape is moved slightly in some embodiments, providing more room for some other critical route in the vicinity. Specific automation tools which take advantage of this include intelligent compaction algorithms, for example.

Rectilinear shapes simply cannot be manufactured as drawn, due to limitations caused by the laws of physics. Curvilinear shapes on the other hand in some embodiments are drawn which are far closer to those which are actually manufactured. Since the target shapes are curvilinear now to begin with, and thus easier to create optimal masks for, they are in turn be manufactured with reduced variability. Here, the resulting manufactured inner and outer contours are closer to the nominal contours than would be the case for rectilinear shapes. The corresponding minimum/maximum resistance values would be closer to the nominal resistance, i.e., the resistance spread or variance would be correspondingly smaller. In turn, this leads to improved overlap area, reduced resistance, and improved long-term reliability. The ability to know the precise manufactured contours and associated resistance values of the curvilinear shapes therefore allows a designer to target specific via or contact instances to be drawn in a curvilinear form.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

FIG. 37 conceptually illustrates an electronic system 3700 with which some embodiments of the invention are implemented. The electronic system 3700 may be a computer (e.g., a desktop computer, personal computer, tablet computer, server computer, mainframe, a blade computer etc.), phone, PDA, or any other sort of electronic device. As shown, the electronic system includes various types of computer readable media and interfaces for various other types of computer readable media. Specifically, the electronic system 3700 includes a bus 3705, processing unit(s) 3710, a system memory 3725, a read-only memory 3730, a permanent storage device 3735, input devices 3740, and output devices 3745.

The bus 3705 collectively represents all system, peripheral, and chipset buses that communicatively connect the numerous internal devices of the electronic system 3700. For instance, the bus 3705 communicatively connects the processing unit(s) 3710 with the read-only memory (ROM) 3730, the system memory 3725, and the permanent storage device 3735. From these various memory units, the processing unit(s) 3710 retrieve instructions to execute and data to process in order to execute the processes of the invention. The processing unit(s) may be a single processor or a multi-core processor in different embodiments.

The ROM 3730 stores static data and instructions that are needed by the processing unit(s) 3710 and other modules of the electronic system. The permanent storage device 3735, on the other hand, is a read-and-write memory device. This device is a non-volatile memory unit that stores instructions and data even when the electronic system 3700 is off. Some embodiments of the invention use a mass-storage device (such as a magnetic or optical disk and its corresponding disk drive) as the permanent storage device 3735.

Other embodiments use a removable storage device (such as a floppy disk, flash drive, etc.) as the permanent storage device. Like the permanent storage device 3735, the system memory 3725 is a read-and-write memory device. However, unlike storage device 3735, the system memory is a volatile read-and-write memory, such a random access memory. The system memory stores some of the instructions and data that the processor needs at runtime. In some embodiments, the invention's processes are stored in the system memory 3725, the permanent storage device 3735, and/or the read-only memory 3730. From these various memory units, the processing unit(s) 3710 retrieve instructions to execute and data to process in order to execute the processes of some embodiments.

The bus 3705 also connects to the input and output devices 3740 and 3745. The input devices enable the user to communicate information and select commands to the electronic system. The input devices 3740 include alphanumeric keyboards and pointing devices (also called "cursor control devices"). The output devices 3745 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 37, bus 3705 also couples electronic system 3700 to a network 3765 through a network adapter (not shown). In this manner, the computer can be a part of a network of computers (such as a local area network ("LAN"), a wide area network ("WAN"), or an Intranet, or a network of networks, such as the Internet. Any or all components of electronic system 3700 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. For instance, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Therefore, one of ordinary skill in the art would understand that the invention is not to be limited by the foregoing illustrative details, but rather is to be defined by the appended claims.

The invention claimed is:

1. An electronic design automation (EDA) method for producing a predicted overlap shape of a multi-layer interface of an integrated circuit (IC) design, the method comprising:

generating the IC design with at least two defined shapes for the multi-layer interface on at least two layers of the IC design;

receiving from a designer data that specifies how to model misalignment between the two layers;

using the received data to misalign the two IC-design layers and thereby misalign the two defined shapes of the multi-layer interface;

generating the predicted overlap shape of the multi-layer interface from the misaligned two defined shapes; and presenting the predicted overlap shape for display on a display screen, wherein receiving the data comprises providing a set of tools in a graphical user interface (GUI) to allow the designer to provide data that specifies how to model misalignment between the two layers, the set of UI tools providing to the designer a representative selection of misalignment translation values to misalign the two layers.

2. The EDA method of claim 1, wherein the two defined shapes are a first pair of later-defined shapes that predict how a second pair of earlier-defined shapes for the multi-layer interface would appear after a subsequent manufacturing stage.

3. The EDA method of claim 2 further comprising using a machine-trained network to produce at least the first pair of later-defined shapes from the second pair of earlier-defined shapes, the machine-trained network producing a predicted first pair of shapes by accounting for deformities produced during the subsequent manufacturing stage.

4. The EDA method of claim 3, wherein the machine-trained network further accounts for a variation in a manufacturing process associated with the subsequent manufacturing stage.

5. The EDA method of claim 1, wherein the predicted overlap shape is presented to allow the designer to assess feasibility of manufacturing the IC based on the design.

6. The EDA method of claim 1, wherein the representative selection uses vector directions commensurate with a plurality of compass directions, and a user specified maximum misalignment value.

7. The EDA method of claim 6, wherein the plurality of compass directions are 4 cardinal compass directions.

8. The EDA method of claim 6, wherein the plurality of compass directions are 4 ordinal compass directions.

9. The EDA method of claim 6, wherein the plurality of compass directions are 4 cardinal and 4 ordinal compass directions.

10. A non-transitory machine readable medium storing an electronic design automation (EDA) program for producing a predicted overlap shape of a multi-layer interface of an integrated circuit (IC) design, the program for execution by at least one processing unit of a computer, the program comprising sets of instructions for:

generating the IC design with at least two defined shapes for the multi-layer interface on at least two layers of the IC design;

receiving from a designer data that specifies how to model misalignment between the two layers;

using the received data to misalign the two IC-design layers and thereby misalign the two defined shapes of the multi-layer interface;

generating the predicted overlap shape of the multi-layer interface from the misaligned two defined shapes; and presenting the predicted overlap shape for display on a display screen, wherein receiving the data comprises providing a set of tools in a graphical user interface (GUI) to allow the designer to provide data that specifies how to model misalignment between the two layers, the set of UI tools providing to the designer a representative selection of misalignment translation values to misalign the two layers.

11. The non-transitory machine readable medium of claim 10, wherein the two defined shapes are a first pair of later-defined shapes that predict how a second pair of earlier-defined shapes for the multi-layer interface would appear after a subsequent manufacturing stage.

12. The non-transitory machine readable medium of claim 11, wherein the program further comprises a set of instructions for using a machine-trained network to produce at least the first pair of later-defined shapes from the second pair of earlier-defined shapes, the machine-trained network producing a predicted first pair of shapes by accounting for deformities produced during the subsequent manufacturing stage.

13. The non-transitory machine readable medium of claim 12, wherein the machine-trained network further accounts for a variation in a manufacturing process associated with the subsequent manufacturing stage.

14. The non-transitory machine readable medium of claim 10, wherein the predicted overlap shape is presented to allow the designer to assess feasibility of manufacturing the IC based on the design.

15. The non-transitory machine readable medium of claim 10, wherein the representative selection uses vector directions commensurate with a plurality compass directions, and a user specified maximum misalignment value.

16. The non-transitory machine readable medium of claim 10, wherein the representative selection uses a user-specified maximum misalignment value as a magnitude of the translation values.

17. The non-transitory machine readable medium of claim 10, wherein the set of instructions for presenting for display comprises a set of instructions for generating the display by superimposing the predicted overlap shape on the design layout.

18. The non-transitory machine readable medium of claim 10, wherein the set of instructions for generating the predicted overlap shape comprises sets of instructions for:

for the multi-layer interface:

identifying one shape on each layer of at least two layers traversed by the multi-layer interface; and intersecting the identified shapes to produce a predicted minimum overlap shape for the multi-layer interface.

* * * * *